(12) United States Patent
Nagumo

(10) Patent No.: US 6,717,604 B2
(45) Date of Patent: Apr. 6, 2004

(54) ARRAY DRIVING CIRCUIT WITH CONTROL VOLTAGE ADJUSTED AT BOTH ENDS, AND ARRAY HEAD USING SAME

(75) Inventor: Akira Nagumo, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 10/134,587

(22) Filed: Apr. 30, 2002

(65) Prior Publication Data

US 2002/0163017 A1 Nov. 7, 2002

(30) Foreign Application Priority Data

May 2, 2001 (JP) .......................................... 2001-135039

(51) Int. Cl.[7] ................................ B41J 2/35; F21S 4/00
(52) U.S. Cl. ......................................... 347/237; 362/800
(58) Field of Search ............................... 315/169.1, 291; 347/130, 133, 148, 237, 238; 362/800

(56) References Cited

U.S. PATENT DOCUMENTS

| 5,517,151 A | * | 5/1996 | Kubota | 327/514 |
| 5,734,406 A | * | 3/1998 | Nakamura et al. | 347/132 |
| 5,815,025 A | * | 9/1998 | Kubota | 327/514 |
| 5,892,532 A | * | 4/1999 | Katakura et al. | 347/240 |
| 6,194,960 B1 | * | 2/2001 | Nagumo | 327/565 |
| 6,535,235 B1 | * | 3/2003 | Nagumo | 347/237 |

FOREIGN PATENT DOCUMENTS

JP          09-174918          7/1997

* cited by examiner

Primary Examiner—Don Wong
Assistant Examiner—D. A. Minh
(74) Attorney, Agent, or Firm—Rabin & Berdo, P.C.

(57) ABSTRACT

A driving circuit includes an array of driving elements that selectively supply current from a power supply to an array of driven elements at a rate responsive to the difference between a control voltage and the power supply voltage. The control voltage is furnished to the driving elements through a conductive member that extends parallel to the array of driving elements. The driving circuit includes means for adjusting the control voltage independently at each end of the conductive member, to reduce variations in the current supplied by different driving elements.

20 Claims, 23 Drawing Sheets

| TERMINAL LEVELS ||  MODE | OPERATION |
| --- | --- | --- | --- |
| ADJ-L1/ADJ-R1 | ADJ-L0/ADJ-R0 | | |
| HIGH | HIGH | 3 | NO ADJUSTMENT |
| HIGH | LOW | 2 | L+ OR R+ |
| LOW | HIGH | 1 | L− OR R− |
| LOW | LOW | 0 | NO ADJUSTMENT |

ARRAY DRIVING CIRCUIT WITH CONTROL VOLTAGE ADJUSTED AT BOTH ENDS, AND ARRAY HEAD USING SAME

BACKGROUND OF THE INVENTION

1. Field of the Invention

The present invention relates to a circuit for driving an array of elements such as light-emitting diodes used as light sources in an electrophotographic printer or resistive heat-emitting elements used as heat sources in a thermal printer, and to an array head incorporating this circuit.

2. Description of the Related Art

As an example of a conventional circuit for driving an array of elements, Japanese Unexamined Patent Application Publication No. 9-174918 discloses a circuit for driving an array of light-emitting diodes (hereinafter, LEDs) in an electrophotographic printer. This circuit and printer will be described below with reference to FIGS. 16 to 24.

In the printer, the LED array selectively illuminates a charged photosensitive drum to form a latent image, which is developed by application of toner to form a toner image, and the toner image is transferred to and fused onto a sheet of paper. The control system of the printer is shown in FIG. 16. The printing control unit 1 is a computing device comprising a microprocessor, read-only memory (ROM), random-access memory (RAM), input-output ports, timers, and other facilities. Upon receiving signals SG1, SG2, etc. from a higher-order controller (not visible), the printing control unit 1 generates signals that control a sequence of operations for printing dot-mapped data. The data are provided in signal SG2, which is sometimes referred to as a video signal because it supplies the dot-mapped data one-dimensionally.

The printing sequence starts when the printing control unit 1 receives a printing command from the higher-order controller by means of control signal SG1. First, a temperature (Temp.) sensor 23 is checked to determine whether a fuser 22 is at the necessary temperature for printing. If it is not, current is fed to a heater 22a to raise the temperature of the fuser 22.

When the fuser 22 is ready, the printing control unit 1 commands a motor driver 2 to drive a develop-transfer process motor (PM) 3, activates a charge signal SGC to turn on a high-voltage (HV) charging power source 25, and thereby charges the developing unit (D) 27.

In addition, a paper sensor 8 is checked to confirm that paper is present in a cassette (not visible), and a size sensor 9 is checked to determine the size of the paper. If paper is present, another motor driver 4 drives a paper transport motor (PM) 5 according to the size of the paper, first in one direction to transport the paper to a starting position sensed by a pick-up sensor 6, then in the opposite direction to transport the paper into the printing mechanism.

When the paper is in position for printing, the printing control unit 1 sends the higher-order controller a timing signal SG3 (including a main scanning synchronization signal and a sub-scanning synchronization signal) as shown in FIG. 17. The higher-order controller responds by sending the dot data for one page in the video signal SG2. The printing control unit 1 sends corresponding dot data (HD-DATA) to an LED head 19 in synchronization with a clock signal (HD-CLK). The LED head 19 comprises a linear array of LEDs for printing respective dots (also referred to as picture elements or pixels).

After receiving data for one line of dots in the video signal SG2 and sending the data to the LED head 19, the printing control unit 1 sends the LED head 19 a latch signal (HD-LOAD), causing the LED head 19 to store the print data (HD-DATA). The print data stored in the LED head 19 can then be printed while the printing control unit 1 is receiving the next print data from the higher-order controller in the video signal SG2.

The video signal SG2 is transmitted and received one printing line at a time. FIG. 17 illustrates the printing of three consecutive dot lines N−1, N, and N+1. For each line, the LED head 19 forms a latent image of dots with a comparatively high electric potential on the negatively charged photosensitive drum (not visible). In the developing unit 27, negatively charged toner is electrically attracted to the dots, forming a toner image.

The toner image is then transported to a transfer unit (T) 28. The printing control unit 1 activates a high-voltage transfer power source 26 by sending it a transfer signal SG4, and the toner image is transferred to a sheet of paper passing between the photosensitive drum and transfer unit 28. The sheet of paper carrying the transferred toner image is transported to the fuser 22, where the toner image is fused onto the paper by heat generated by the heater 22a. Finally, the sheet of paper carrying the fused toner image is transported out of the printing mechanism, passing an exit sensor 7, and ejected from the printer.

The printing control unit 1 controls the high-voltage transfer power source 26 according to the information detected by the pick-up sensor 6 and size sensor 9 so that voltage is applied to the transfer unit 28 only while paper is passing through the transfer unit 28. When the paper passes the exit sensor 7, the printing control unit 1 stops the supply of voltage from the high-voltage charging power source 25 to the developing unit 27, and halts the develop/transfer process motor 3. The above operations are repeated to print a series of pages.

FIG. 18 is a simplified schematic drawing showing the circuit structure of the LED head 19. The print data signal HD-DATA and clock signal HD-CLK are used to shift bit data for two thousand four hundred ninety-six dots, a number suitable for printing on A4-size paper at a resolution of three hundred dots per inch, into a shift register comprising flip-flops FF1, FF2, . . . , FF2496. The latch signal HD-LOAD causes latches LT1, LT2, . . . , LT2496 to latch the bit data. The strobe signal HD-STB-N activates a circuit comprising an inverter G0, pre-buffers G1, G2, . . . , G2496, and switching elements Tr1, Tr2, . . . , Tr2496 that drive a linear array of light-emitting elements LD1, LD2, . . . , LD2496 according to the latched bit data. The switching elements are p-channel metal-oxide-semiconductor (MOS) transistors; the light-emitting elements are LEDs.

The LED head 19 is supplied with power at a voltage denoted VDD in this drawing and the next. Some of this power is supplied as current to drive the LEDs. The notation VDDH will be used later to denote the voltage of the LED driving power supply.

As shown in FIG. 19, the LED head 19 comprises a plurality of LED array chips 101 driven by corresponding driver integrated circuits (ICs) 100. In this example, there are twenty-six LED array chips and twenty-six driver ICs. The driver ICs 100 are connected in cascade. Each LED array chip 101 includes ninety-six LEDs. The LED head 19 also has a reference voltage generator 102 for supplying a reference voltage Vref to the driver ICs 100.

Each driver IC 100 has the same internal circuit configuration, comprising: a shift register 100a with ninety-six flip-flops that receive the printing data (HD-DATA) in synchronization with the clock signal (HD-CLK); a latch circuit 100b that latches the output signals from the shift register 100a in response to the latch signal (HD-LOAD); an inverter 100e that inverts the strobe signal (HD-STB-N) from negative to positive logic; an AND logic circuit 100c that gates the output signals from the latch circuit 100b according to the output of the inverter 100e; an LED driving circuit 100d that supplies driving current to the LEDs in the corresponding LED array chip 101 in response to the output signals of the AND circuit 100c; and a control voltage generator 100f that supplies a control voltage to the LED driving circuit 100d.

In the printing process, when the HD-DATA, HD-CLK, HD-LOAD, and HD-STB-N signals are sent from the printing control unit 1 to the LED head 19, the LEDs that are driven are driven simultaneously for the same length of time, as determined by the strobe signal HD-STB-N (this time is denoted LDT in FIG. 17). Any variations in the electrical characteristics of transistors Tr1, Tr2, . . . , Tr2496 and LEDs LD1, LD2, . . . , LD2496 may therefore lead to variations in the driving current, thus to variations in the intensity of the emitted light. As a result, the dots in the latent image formed on the photosensitive drum may differ in size, leading to printed dots of different sizes.

FIG. 20 shows an example of the above variations in LED driving current and dot size. DRV1 to DRV26 are driver ICs that drive LED array chips CHP1 to CHP26, respectively. The ninety-six LEDs in each LED array chip are wire-bonded to corresponding output terminals of the driver ICs, as will be shown in FIG. 23. The twenty-six driver ICs in FIG. 20 are connected so that externally input printing data are transferred serially from one driver IC to the next.

Although it is desirable for each of the driver ICs DRV1 to DRV26 to supply the same amount of driving current to the LEDs it drives, circuit-element characteristics vary according to various factors in the semiconductor fabrication processes, so there is inevitably some variation in the driving current. As noted above, this variation leads to variations in the amount of light (the optical power) emitted by each LED, so that the photosensitive drum receives uneven exposure energy, and different-sized dots are developed. On a printed page consisting mainly of text, the dot-size variations are rarely noticed, but when a natural image such as a photograph is printed, the dot-size variations become perceptible as variations in printing density, causing undesirable printing quality defects.

To avoid such printing defects, the LED array head manufacturer screens the driver ICs, selects those in which the driving-current variation does not exceed a certain limit ΔI, groups these driver ICs according to their average driving current, and assembles each LED head with driver ICs taken from the same group.

Further details of the driver ICs will now be described. FIG. 21 shows the connection relationships between the pre-buffers G1, G2, . . . , G2496 in FIG. 18 and their peripheral circuits, showing the circuit elements (LT1, G1, Tr1, LD1) related to the first dot. Pre-buffer G1 includes an AND gate AD1, a p-channel MOS transistor TP1, and an n-channel MOS transistor TN1.

FIG. 21 also shows the control voltage generator 100f, which includes an operational amplifier 200, a reference resistance Rref, and a p-channel MOS transistor 201 that functions as a reference transistor. The reference transistor 201 and the p-channel MOS transistors Tr1, Tr2, . . . , Tr2496 that function as switching elements in FIG. 18 have the same gate length, and receive the same voltage VDDH at their source electrodes. For simplicity, it will be assumed below that the reference transistor 201 also has the same gate width as transistors Tr1, Tr2, . . . , Tr2496.

The operational amplifier 200 receives the reference voltage Vref supplied from the reference voltage generator 102 in FIG. 19 at its inverting input terminal, and outputs a control voltage Vcontrol to the gate electrode of the reference transistor 201. The operational amplifier 200, reference transistor 201, and reference resistance Rref are interconnected to form a feedback control circuit that holds the current Iref flowing through the reference transistor 201 and reference resistance Rref to a constant value determined by Vref and Rref. In effect, the control voltage generator 100f detects VDDH and generates a control voltage Vcontrol that produces a constant reference current Iref despite variations in VDDH.

Vcontrol is also supplied through pre-buffer G1 to the gate electrode of transistor Tr1 to switch transistor Tr1 on. When switched on, transistor Tr1 supplies LED LD1 with a constant current equal to the reference current Iref and independent of VDDH.

FIG. 22 schematically shows the layout of a conventional driver IC 300, such as the driver IC disclosed in Japanese Unexamined Patent Application Publication No. 6-297765. This driver IC 300 is a rectangular chip with a row of electrodes 301 arranged along one longitudinal edge for input and output of signals such as HD-DATA, HD-CLK, HD-LOAD, and HD-STB-N. Disposed above this row of electrodes 301, in order from bottom to top in the drawing, are a shift register 302, a latch circuit 303, a pre-buffer circuit 304 including AND gates and inverters, a conductive member 305 used as a ground pattern for the pre-buffer circuit 304, an LED driving power supply electrode or VDDH electrode 306, a row of LED driving transistors 307, and a staggered double row of LED driving electrodes 308. The ninety-six LED driving electrodes DO1, DO2, . . . , DO95, DO96 in the double row are aligned with the associated driving transistors 307 and with other associated circuit elements in circuits 302–304, as indicated by the vertical lines in the drawing. The input and output signal electrodes 301 and LED driving electrodes 308 are aluminum pads.

The VDDH electrode 306 is an aluminum band of width W, disposed between and parallel to the row of pre-buffers 304 and the row of LED driving transistors 307. A plurality of electrode pads 309 are formed on the VDDH electrode 306 to receive power at voltage VDDH from an external source (not shown). In the drawing, there are three electrode pads 309, aligned with LED driving electrodes DO16, DO48, and DO80.

FIG. 23 shows a schematic side view of the driver IC 300 in FIG. 22. The input and output signal electrodes 301 and VDDH electrode pads 309 are connected by bonding wires 310 to corresponding electrodes on a printed wiring board (not visible) on which the driver IC is mounted. The LED driving electrodes 308 are connected by bonding wires 311 to corresponding electrodes on an LED array chip (not visible).

FIG. 24 is an equivalent circuit diagram showing the ninety-six p-channel MOS driving transistors M1, M2, . . . , M96 that function as switching elements in one driver IC, and the driven LEDs D1, D2, . . . , D96. These transistors and LEDs correspond to the transistors and LEDs denoted Tr1, Tr2, . . . and LD1, LD2, . . . in FIGS. 18 and 21. Also shown is a reference transistor M0 equivalent to the reference transistor 201 in FIG. 21. The position of reference transistor M0 is indicated by hatching in FIG. 22.

The source electrodes of transistors M1, M2, ..., M96 are connected to the VDDH electrode 306 at nodes S1, S2, ..., S96 in FIG. 24. The resistance of the VDDH electrode 306 between these nodes is modeled by resistors R1, R2, ..., R95. An additional resistor R0 models the resistance between node S1 and the source electrode of reference transistor M0. The resistance of the three bonding wires 310 that supply power to the VDDH electrode 306 is modeled by resistors R201, R202, R203. Given the layout shown in FIG. 22, in which the VDDH electrode pads 309 are aligned with LED driving electrodes DO16, DO48, DO80, these resistors R201, R202, R203 can be considered to be connected to the source electrodes of driving transistors M16, M48, M80 at nodes S16, S48, S80, respectively.

The drain electrodes of driving transistors M1, M2, ..., M96 are connected to the anode electrodes of LEDs D1, D2, ..., D96. When switched on, the driving transistors M1, M2, ..., M96 supply current Io to the corresponding LEDs at a rate determined by their gate-source voltage, which depends on the control voltage Vcontrol generated by the control voltage generator shown in FIG. 21.

In FIGS. 22 and 24, driving transistor M1 and reference transistor M0 are mutually adjacent and therefore have substantially identical electrical characteristics and gate-source voltages. The current Io supplied by driving transistor M1 is therefore substantially equal to the constant reference current Iref flowing through reference transistor M0, as desired. In the driver IC as a whole, however, the driving current may vary, making it necessary to screen out driver ICs in which the variation exceeds a limit ΔI, as noted above.

Referring again to FIG. 20, there tends to be little difference in the driving current supplied by the driving transistors at mutually adjacent dot positions within one driver IC chip. Furthermore, the variation within the driver IC chip as a whole tends to be a monotonic increase or decrease according to the dot position, for the following reason.

The driver ICs are formed on a circular silicon wafer on which electrical characteristics such as MOS transistor threshold voltages usually show a concentric pattern of variation. A driver IC chip formed near the periphery of the wafer, at a point where the long axis of the chip aligns with the concentric pattern, will display little variation in driving current, but only a few such chips can be obtained from each wafer. Most of the chips are disposed in positions where their long axes cut across the concentric pattern, producing driving current that increases or decreases from one dot to the next along the length of the chip.

As shown in FIG. 20, even if two adjacent driver ICs have the same average driving current value, if they both have the same increasing or decreasing pattern of dot-to-dot current variation, there may be a considerable difference in driving current between the dot at one end of one chip and the adjacent dot at the adjacent end of the other chip. Moreover, even if the dot-to-dot variation within each driver IC chip is ΔI or less, the variation within the whole head may be as large as 2ΔI in the worst case.

Thus despite the screening of the driver chips, there can be a significant difference in driving current between two mutually adjacent dot positions on different chips, leading to an abrupt change in printing density that persists in the vertical direction on the printed page. While gradual variations in printing density often go unnoticed, the human eye readily perceives an abrupt, persistent change.

SUMMARY OF THE INVENTION

An object of the present invention is accordingly to reduce the size of abrupt element-to-element variations in driving current supplied to an array of driven elements.

Another object of the invention is to reduce gradual variations in the driving current.

The invention provides a driving circuit that drives an array of driven elements. The driving circuit includes an array of driving elements that receive a control voltage, and selectively supply current from a power supply to the driven elements at a rate responsive to the difference between the control voltage and the power supply voltage. The control voltage is furnished to the driving elements through a conductive member that extends parallel to the array of driving elements. The driving circuit includes means for adjusting the control voltage independently at each end of the conductive member.

According to one aspect of the invention, the means for adjusting comprises a pair of control voltage generators. One control voltage generator includes a reference element disposed at a first end of the array of driving elements, and supplies a first control voltage, responsive to the power supply voltage at the first end of the array, to the first end of the conductive member. The other control voltage generator includes a reference element disposed at a second end of the array of driving elements, and supplies a second control voltage, responsive to the power supply voltage at the second end of the array, to the second end of the conductive member.

In this aspect of the invention, the control voltage supplied to a driven element varies between the first and second control voltages according to the position of the driven element between the two ends of the array, thereby counteracting variations in electrical characteristics in the array and reducing variations in driving current. In particular, the driving current supplied by the driving elements at the two ends of the array can be controlled to substantially the same value, so that in an array head employing a plurality of these driving circuits, there are no abrupt changes in driving current from one driving circuit to the next.

According to another aspect of the invention, the control voltage is supplied to the center of the conductive member by a single control voltage generator, and the means for adjusting includes a pair of control voltage adjustment circuits, disposed at mutually opposite ends of the conductive member, that can be independently set to source or sink current, thereby independently raising or lowering the control voltage at the two ends of the conductive member. These control voltage adjustments can reduce gradual variations in driving current across the array.

The single control voltage generator may include a single reference element disposed in the middle of the array of driving elements, or two reference elements disposed at mutually opposite ends of the array. The control voltage supplied to the center of the conductive member may thus be responsive to the power supply voltage at the middle of the array, or to the average of the power supply voltages at the two ends of the array.

The driving elements and reference elements are, for example, transistors with gate electrodes receiving the control voltage.

DETAILED DESCRIPTION OF THE INVENTION

Figure 1:
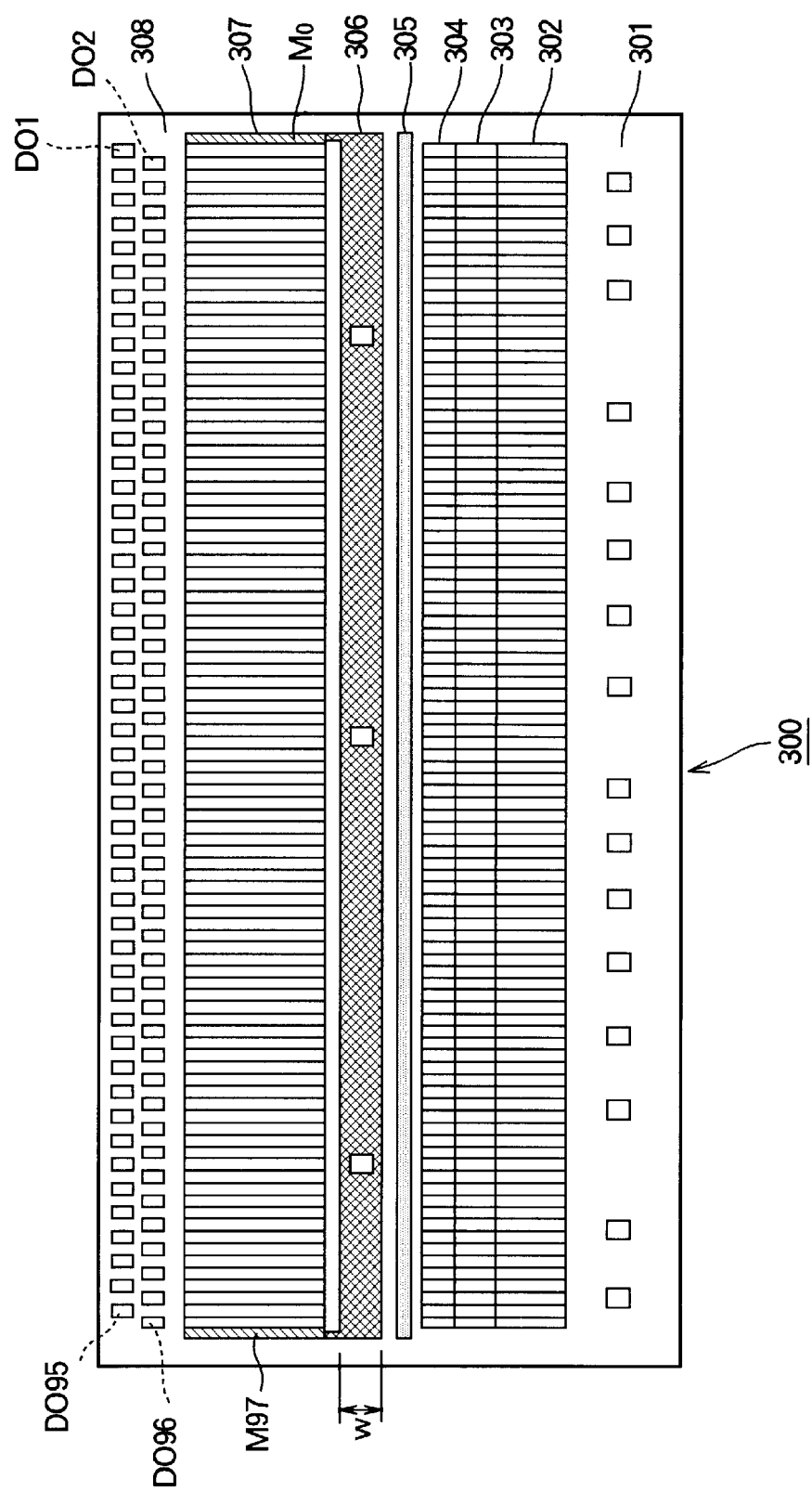
FIG. 1 is a schematic plan view showing the layout of a driver IC according to a first embodiment of the present invention.

Embodiments of the invention will now be described with reference to the attached drawings, using like reference characters to indicate like elements in different drawings.

FIG. 1 schematically shows the layout of a driver IC according to a first embodiment of the invention. Most of the elements shown in FIG. 1 are identical to the corresponding elements in the conventional driver IC in FIG. 22; repeated descriptions of these elements will be omitted.

Figure 22:
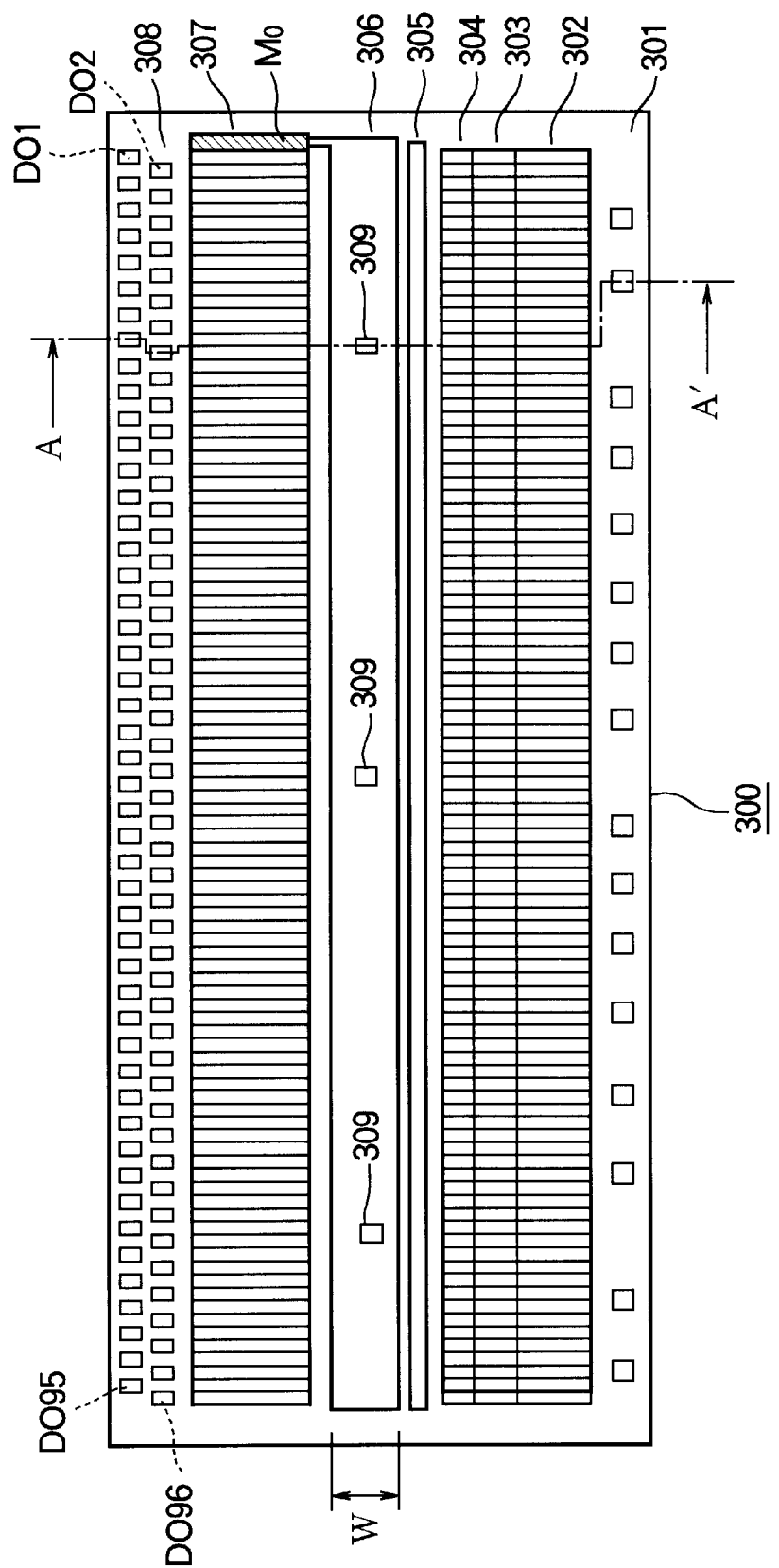
FIG. 22 is a schematic plan view showing the layout of a conventional driver IC.
Figure 23:
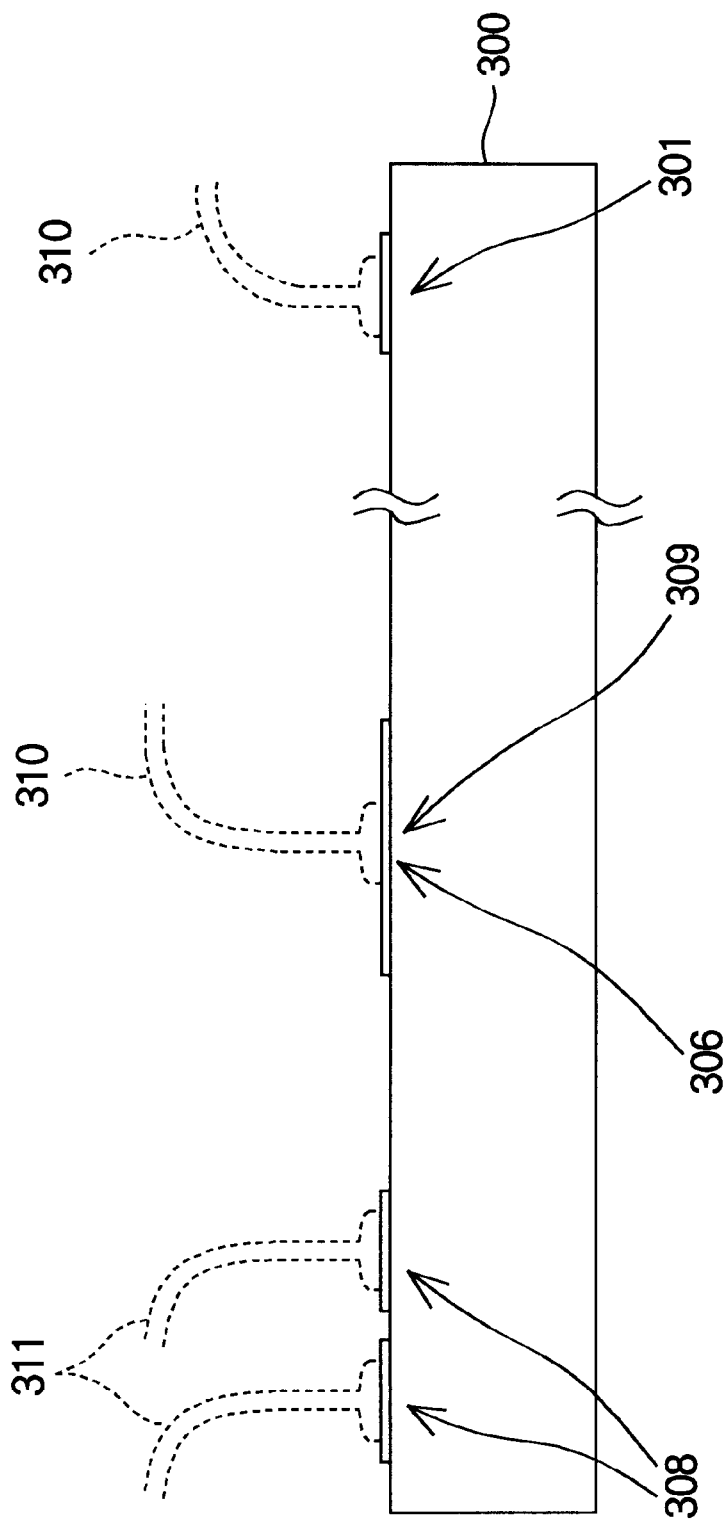
FIG. 23 is a cross-sectional view of the driver IC in FIG. 22.

The driver IC in FIG. 1 differs from the driver IC in FIG. 22 in that it has reference transistors M0, M97 (indicated by hatching) at both ends of the row of driving elements 307 instead of only one end, and generates two corresponding control voltages, responsive to the LED driving power supply voltage VDDH at the two ends of the array. The conductive member 305 is now a source wiring structure comprising, for example, impurity diffusion regions in the IC chip substrate and polysilicon wires, that supplies the control voltages to the driving transistors 307 through the pre-buffers 304. The polysilicon wires may include a tungsten silicide layer for improved conductivity.

Figure 2:
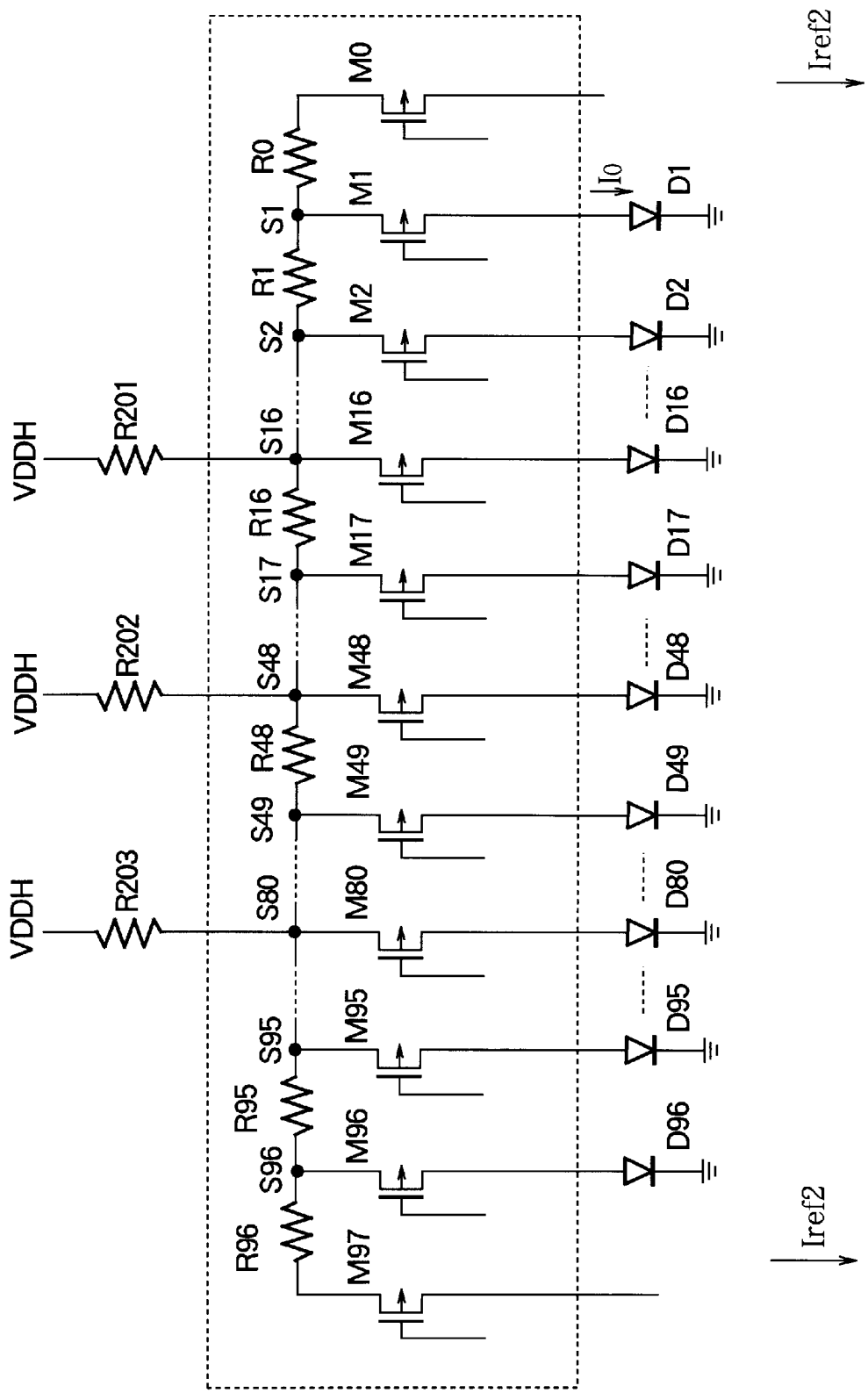
FIG. 2 is an equivalent circuit diagram showing driving transistors in the driver IC in FIG. 1, and the driven LEDs.
Figure 24:
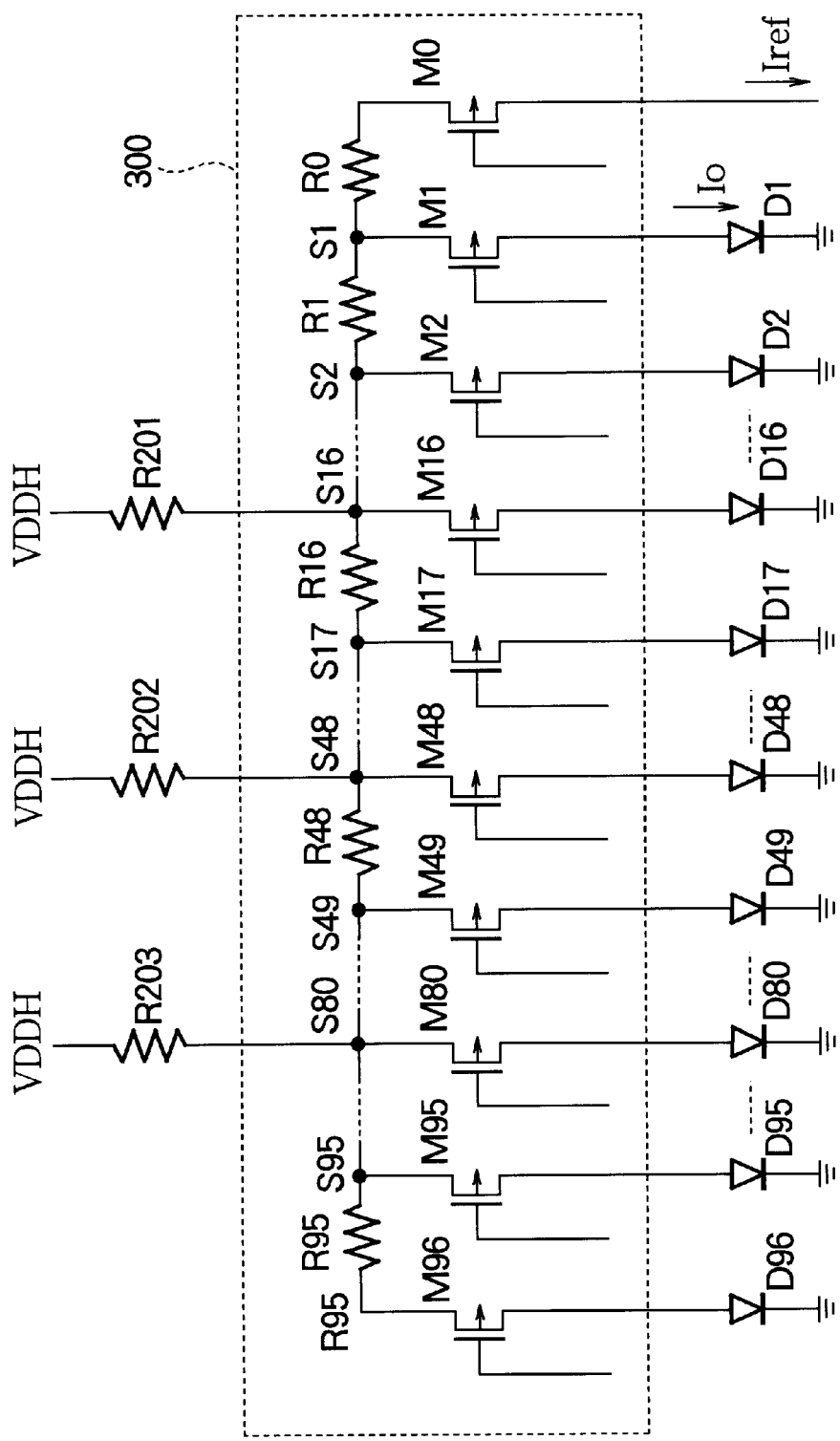
FIG. 24 is an equivalent circuit diagram showing the driving transistors in the driver IC in FIG. 22, and the driven LEDs.

Referring to FIG. 2, the LED driving power supply voltage VDDH is supplied to the source nodes S1–S96 of driving transistors M1–M96, and to the source electrodes of reference transistors M0, M97. Resistors R0–R96 and R201–R203 model the resistance of the VDDH electrode 306 and its bonding wires, as in FIG. 24, the source electrodes of the reference transistors M0, M97 being connected to nodes S1, S96 through resistors R0, R96. The drain currents of the driving transistors M1–M96 are supplied to respective LEDs D1–D96. The drain currents of the reference transistors M0, M97 are reference currents Iref1, Iref2.

Figure 3:
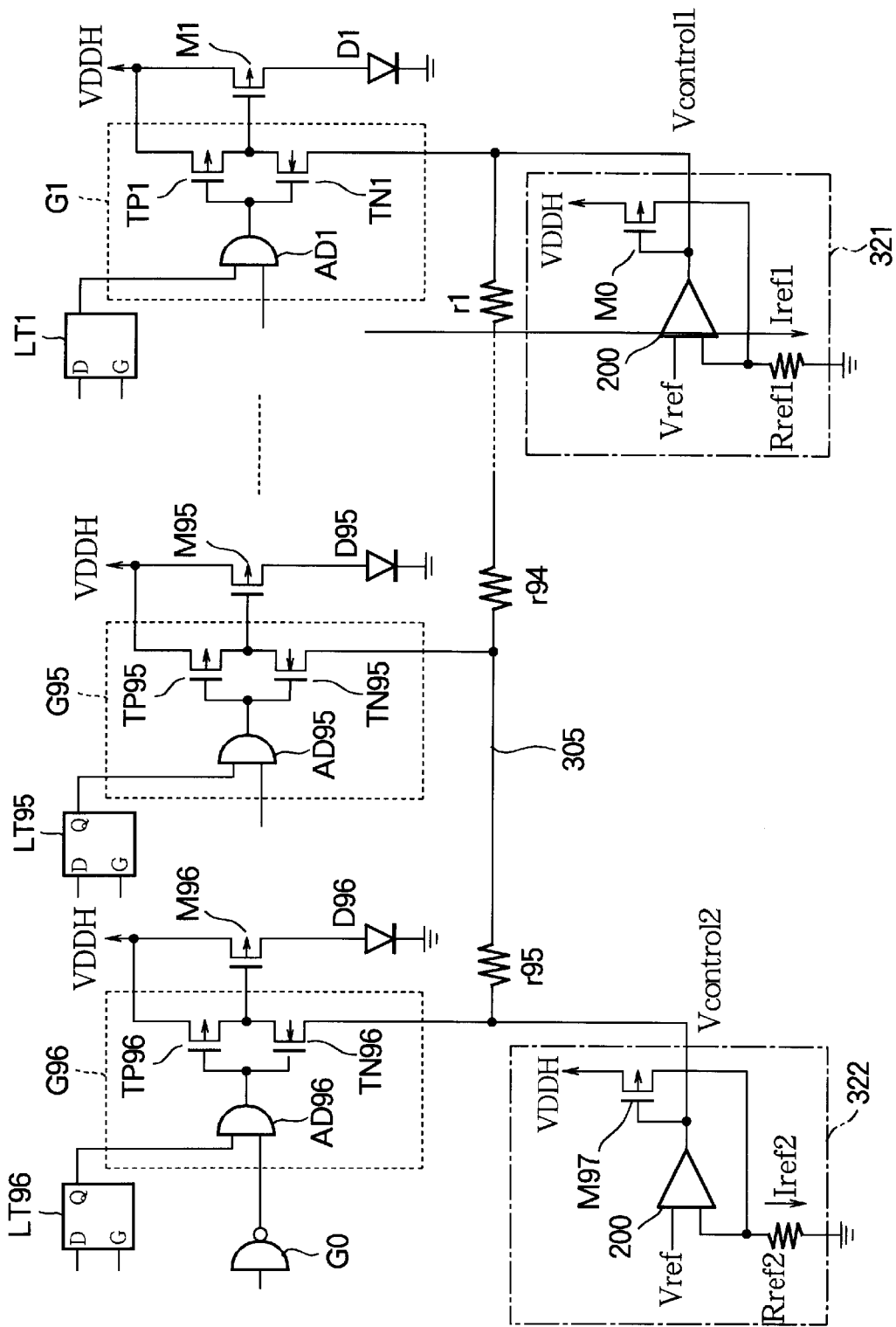
FIG. 3 shows connection relationships of the control voltage generators, pre-buffers, and their peripheral circuits in the driver IC in FIG. 1.
Figure 21:
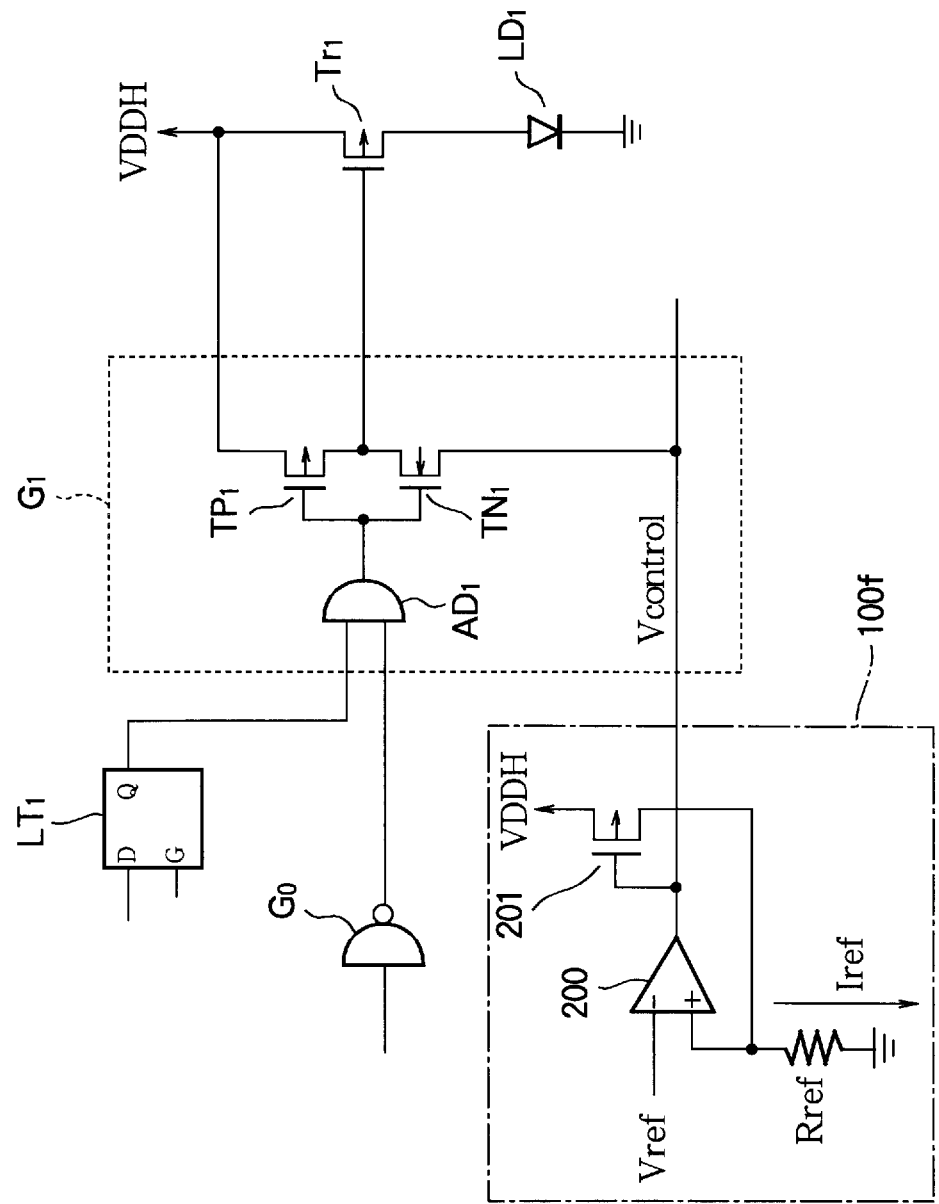
FIG. 21 shows connection relationships of the control voltage generator, a pre-buffer, and its peripheral circuits in the driver IC in FIG. 16.

FIG. 3 shows the connection relationships of the pre-buffers, control voltage generators, and their peripheral circuits for three dots (dot 1, dot 95, dot 96), omitting the circuit elements corresponding to dots 2 to 94 for clarity. LEDs D1, ..., D95, D96 are driven by transistors M1, ..., M95, M96 in the same way that LED LD1 was driven by transistor Tr1 in FIG. 21. Similarly, transistors TP1, ..., TP95, TP96, transistors TN1, ..., TN95, TN96, AND gates AD1, ..., AD95, AD96, and latches LT1, ..., LT95, LT96 function in the same way as transistor TP1, transistor TN1, AND gate AD1, and latch LT1 in FIG. 21.

One of the input terminals of each AND gate AD1, ..., AD95, AD96 is connected to the output terminal of the corresponding latch LT1, ..., LT95, LT96. The other input terminals of all the AND gates are connected to the output terminal of inverter G0. Control voltage generators 321, 322, which correspond to control voltage generator 100f in FIG. 21, generate respective control voltages Vcontrol1 and Vcontrol2. Their reference resistances Rref1 and Rref2, which are used to sense the reference currents Iref1 and Iref2, are preferably located near the center of the row of input-output electrodes 301 in FIG. 1. Resistors r1, ..., r94, r95 model the wiring resistance of the conductive member 305. The polysilicon material (or polysilicon with a tungsten silicide layer) used in the conductive member 305 has a higher sheet resistance than aluminum wiring.

The voltage VDDH supplied to the source electrode of reference transistor M0 is substantially the voltage at node S1 in FIG. 2, while the voltage VDDH supplied to the source electrode of reference transistor M97 is substantially the voltage at node S96. The current supplied by driving transistor M1 is proportional to the reference current Iref1 in control voltage generator 321, while the current supplied by driving transistor M96 is similarly proportional to the reference current Iref2 in control voltage generator 322.

Figure 18:
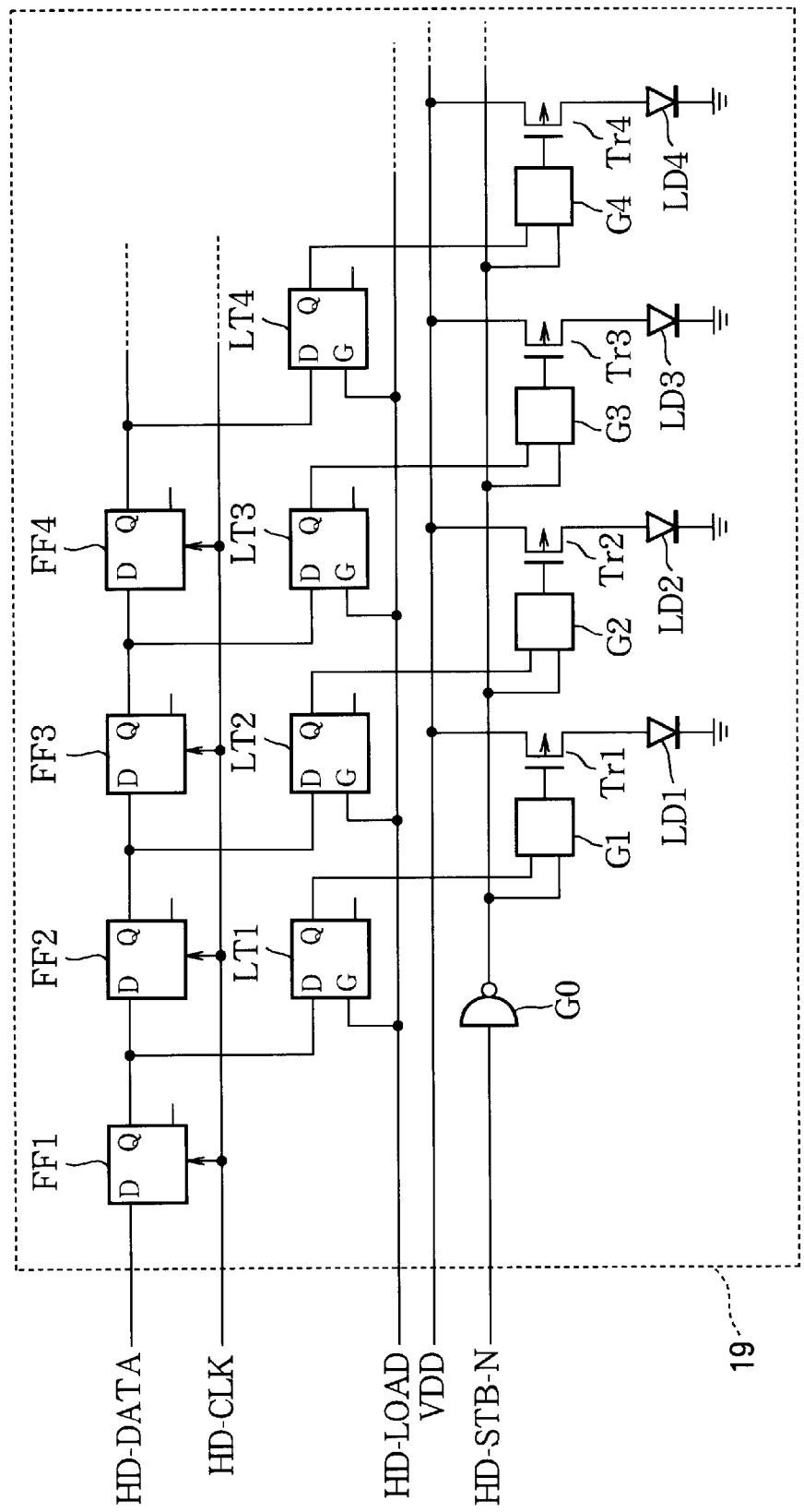
FIG. 18 shows the general circuit configuration of the LED head in FIG. 16.

Next, the operation of the above driver IC will be described with reference to dot 1. The driver IC is assumed to be used in an LED head having the structure shown in FIGS. 18 and 19, and it is assumed here that a high logic level in the printing data functions as a command to turn on an LED.

Figure 19:
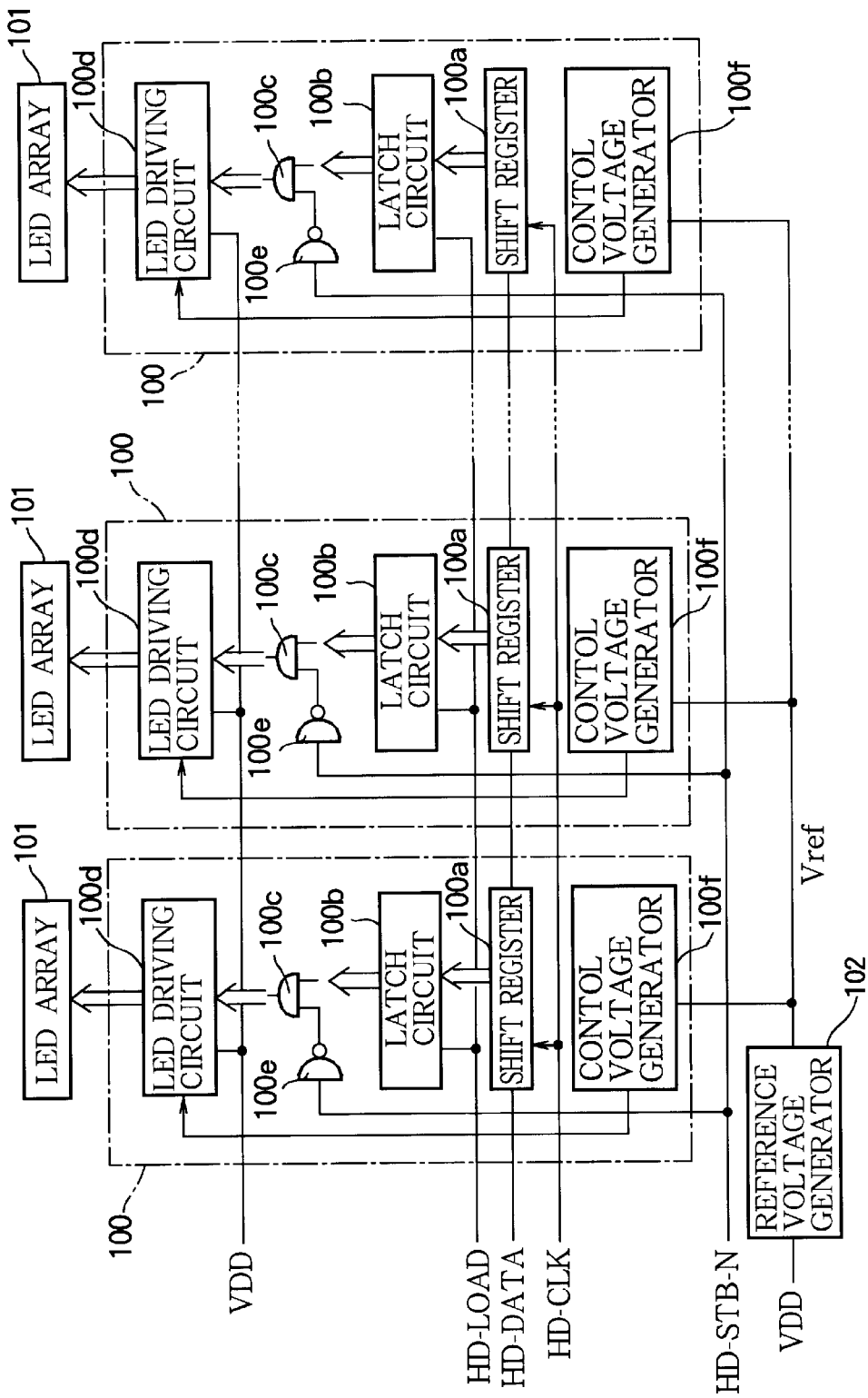
FIG. 19 shows the structure of the LED head in FIG. 16.

The print data signal HD-DATA is transferred into the shift registers 100a in FIG. 19 in the driver ICs. The printing control unit 1 sends the LED head 19 the number of clock pulses (HD-CLK) necessary to transfer one line of dot data. When the transfer of data for one line is completed, the printing control unit 1 activates the latch signal HD-LOAD, and the data held in the shift registers 100a are latched by the latch circuits 100b. The printing control unit 1 then activates the strobe signal HD-STB-N to turn on the LEDs.

The logic of the strobe signal HD-STB-N (active low) is inverted by inverter G0 in FIG. 3. The AND gate AD1 outputs the logical AND of the resulting positive-logic strobe signal and the signal latched in latch circuit LT1. If the signal latched in latch circuit LT1 has the high logic level, accordingly, the output of AND gate AD1 changes from the low to the high logic level. The p-channel MOS transistor TP1 and n-channel MOS transistor TN1 constitute an inverter that inverts the output of AND gate AD1. The output signal of this inverter circuit changes from a potential substantially equal to VDDH to a potential substantially equal to Vcontrol1. The gate potential of p-channel MOS transistor M1 likewise changes from substantially VDDH to substantially Vcontrol1, switching on transistor M1 and supplying driving current to LED D1.

Let L and W be the gate length and the gate width, respectively, of driving transistor M1, and Wref1 be the gate width of reference transistor M0. The gate length of reference transistor M0 is equal to the gate length L of driving transistor M1. As these two p-channel MOS transistors M1 and M0 have the same gate-source voltage (Vgs), the relationship between the LED driving current Io and reference current Iref1 can be obtained from the following equations.

$$Io = \beta(W/L)(Vgs-Vt)^2$$

$$Iref1 = \beta(Wref1/L)(Vgs-Vt)^2$$

where Vt is the MOS transistor threshold voltage. Since the two p-channel MOS transistors M0 and M1 are mutually adjacent, they have substantially the same threshold voltage Vt, and the same constant of proportionality $\beta$.

From the above equations, the relationship between the driving current Io and reference current Iref1 can be expressed as follows.

$$Io/Iref1 = W/Wref1 = K$$

The ratio K between the two currents is referred to as the mirror ratio.

A similar relationship holds between driving transistor M96 and the other control voltage generator 322, comprising an operational amplifier 200, reference resistance Rref2, and reference transistor M97. The relationship between the driving current Io supplied by transistor M97 and reference current Iref2 can be expressed as follows.

$$Io/Iref2 = W/Wref2 = K$$

where Wref2 is the gate width of reference transistor M97. In this embodiment Wref2 is equal to Wref1, although this need not be true in general.

If the reference resistances Rref1, Rref2 are mutually adjacent and have the same planar form, they will have substantially identical resistance values. The two reference currents Iref1, Iref2 will therefore be substantially equal. The drain currents of the reference transistors M0, M97 will then be substantially equal, even though these reference transistors are positioned at mutually opposite ends of the driver IC. Consequently, the drain currents of driving transistors M1 and M96 will be substantially identical. The drain currents of transistors M1 and M96 are the currents that drive LEDs D1 and D96 to form dot 1 and dot 96.

Thus although the proportionality constant $\beta$ and MOS transistor threshold voltage Vt in the above equations vary across the driver IC chip, the driving currents supplied at the two ends of the array will be the same. The values of the reference resistances Rref1, Rref2 may vary from one driver IC to another, due to unavoidable manufacturing process variations, but it is a simple matter to divide the driver ICs into groups based on their driving current values. Driver ICs in the same group will then have substantially identical reference resistance values. If an LED head is made from driver ICs taken from the same group, all of its constituent driver ICs will have substantially identical reference resistance values, and the drain currents of the driving transistors M1 and M96 at the two ends of these driver ICs will all be substantially equal.

Figure 4:
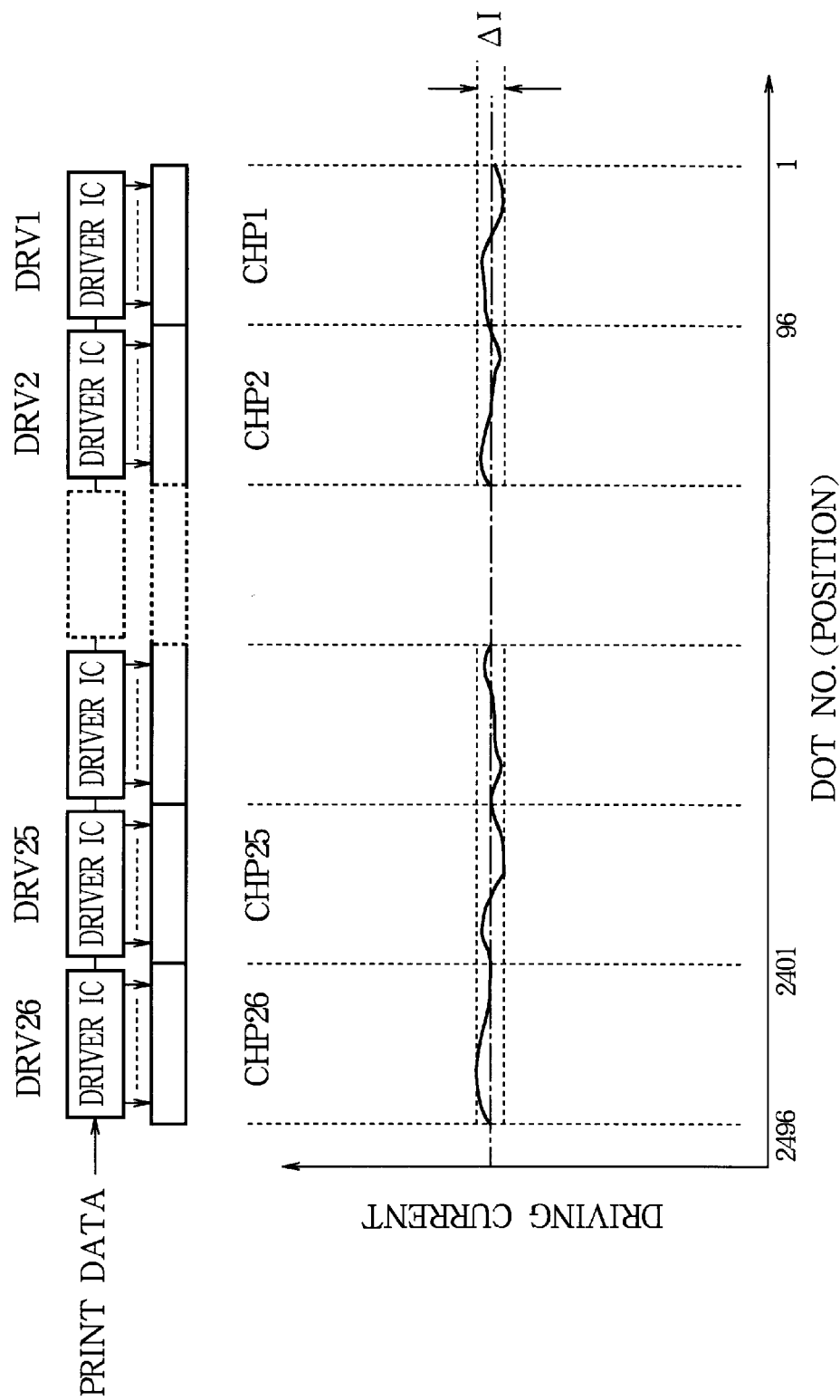
FIG. 4 shows an example of dot-to-dot variations in LED driving current caused by variations in the threshold voltage Vt of the driving transistors in the first embodiment.
Figure 20:
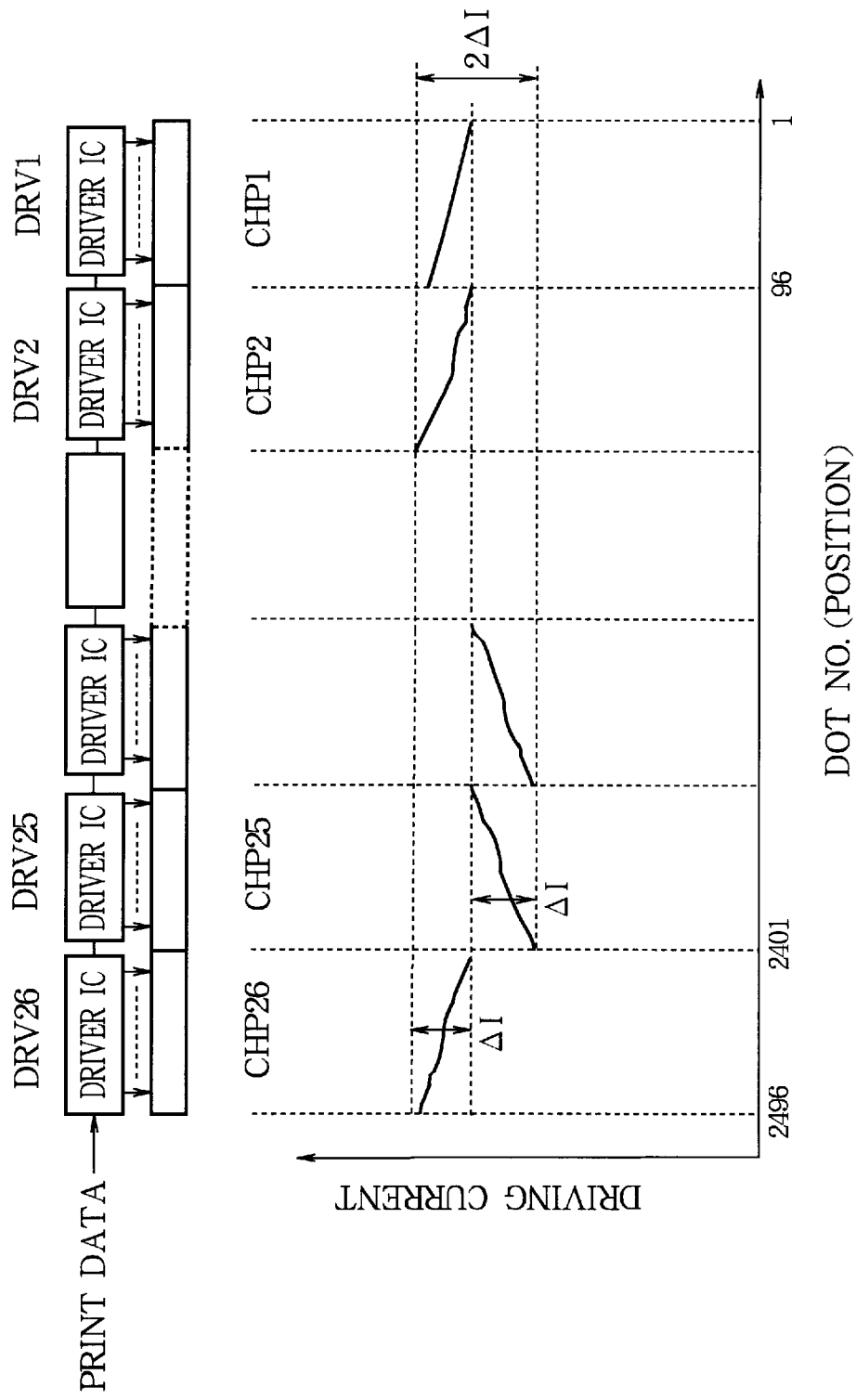
FIG. 20 shows an example of dot-to-dot variations in driving current in the LED head in FIG. 16.

Accordingly, as shown in FIG. 4, there will be no abrupt changes in driving current from one driver IC to the next in the LED head. Moreover, although there may still be some variation in driving current within each driver IC, the driving current will not increase or decrease monotonically as it did in the prior art (FIG. 20). The variation within each driver IC is therefore reduced, the mean driving current value does not depart greatly from the value determined by the reference current, and the total range of variation for the whole LED head will in general be no larger than the range $\Delta I$ allowed for a single driver IC.

The variations in FIG. 4 can be explained as follows. In FIG. 3, the control voltages Vcontrol1 and Vcontrol2 are applied to the two ends of a resistance ladder circuit comprising resistances r1, ..., r94, r95 connected in series. The resistances r1, ..., r94, r95 are the resistance of wiring sections of equal width and equal length, so all have substantially the same value. The control voltage potentials at intermediate nodes in the resistance ladder therefore vary linearly between Vcontrol1 and Vcontrol2, according to the node position. The node potentials of the resistance ladder comprising resistance r1, ..., r94, r95, and hence the gate-source voltage of transistors M1, ..., M95, M96, thus increase or decrease linearly across the chip. This cancels out any linear variation in the transistor threshold value Vt, but the Vt variation may include nonlinear components due to various factors in the IC fabrication process. This accounts for the residual variations in driving current shown in FIG. 4.

The variations within each driver IC in FIG. 4, however, are only about half as large as the conventional variations shown in FIG. 20, and since the driving currents at the adjacent ends of adjacent driver ICs are substantially equal, variations in driving current in the LED head as a whole are reduced to less than half the conventional value. The first embodiment accordingly provides high printing quality without significant unevenness in print density.

Figure 5:
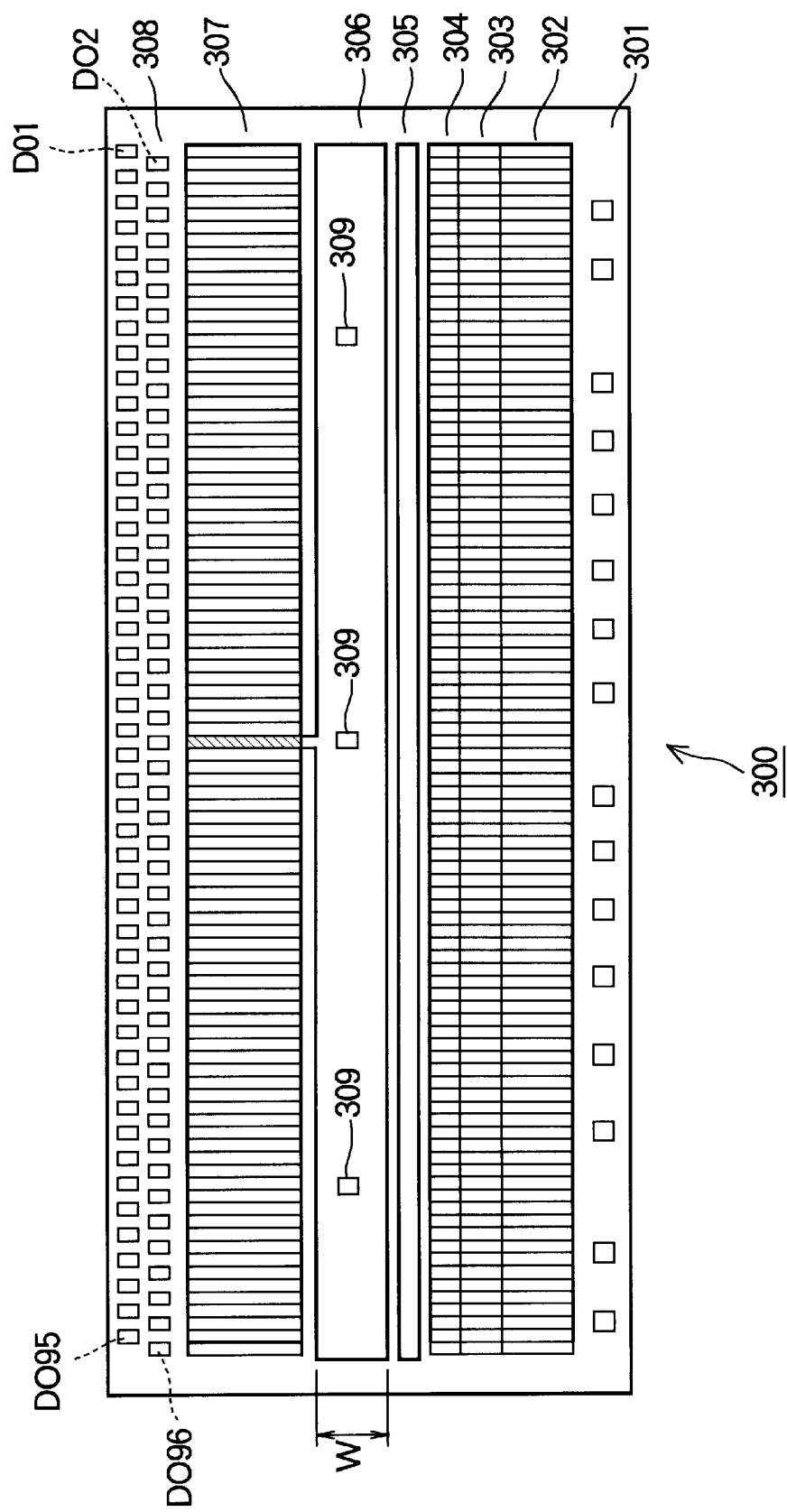
FIG. 5 is a schematic plan view showing the layout of a driver IC according to a second embodiment of the invention.

FIG. 5 schematically shows the layout of a driver IC for driving an array of driven elements according to a second embodiment of the invention. Repeated descriptions of elements appearing in FIG. 1 will be omitted.

The second embodiment differs from the first embodiment in that, instead of two reference transistors positioned at respective ends of the driver IC chip, there is just one reference transistor positioned in the center of the chip, and control voltage adjustment circuits are positioned at both ends of the chip. The reference transistor is indicated by hatching in FIG. 5; the control voltage adjustment circuits will be shown in FIG. 7.

Figure 6:
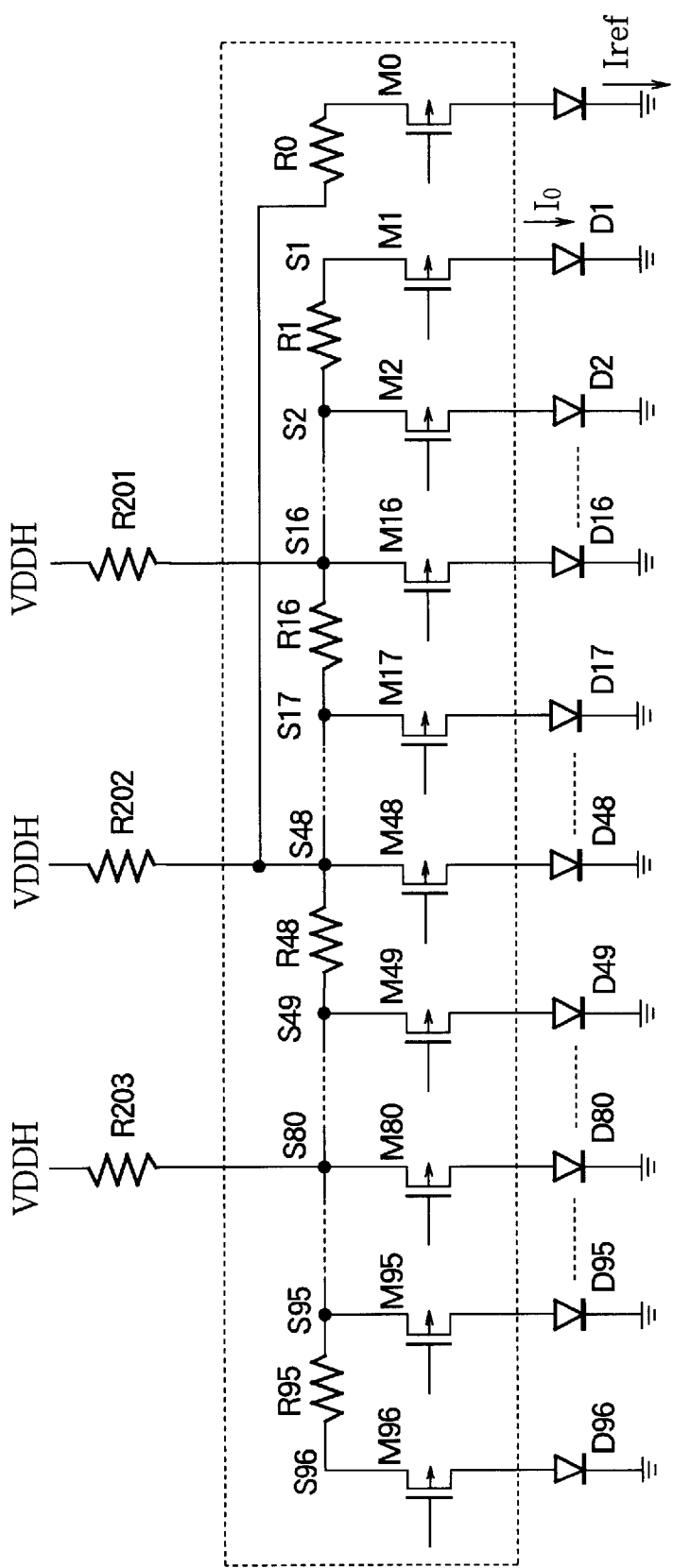
FIG. 6 is an equivalent circuit diagram showing driving transistors in the driver IC in FIG. 5, and the driven LEDs.

FIG. 6 is an equivalent circuit diagram showing the driving transistors in this driver IC and the driven LEDs. Although the reference transistor M0 is shown at the right end of this drawing, it is physically positioned at the center of the row of driving transistors, with its source electrode connected to node S48. Reference current Iref flows from the drain electrode of reference transistor M0 to a reference resistance (not visible). As in the first embodiment, the reference transistor M0 has the same gate length L as driving transistors M1–M96.

Figure 7:
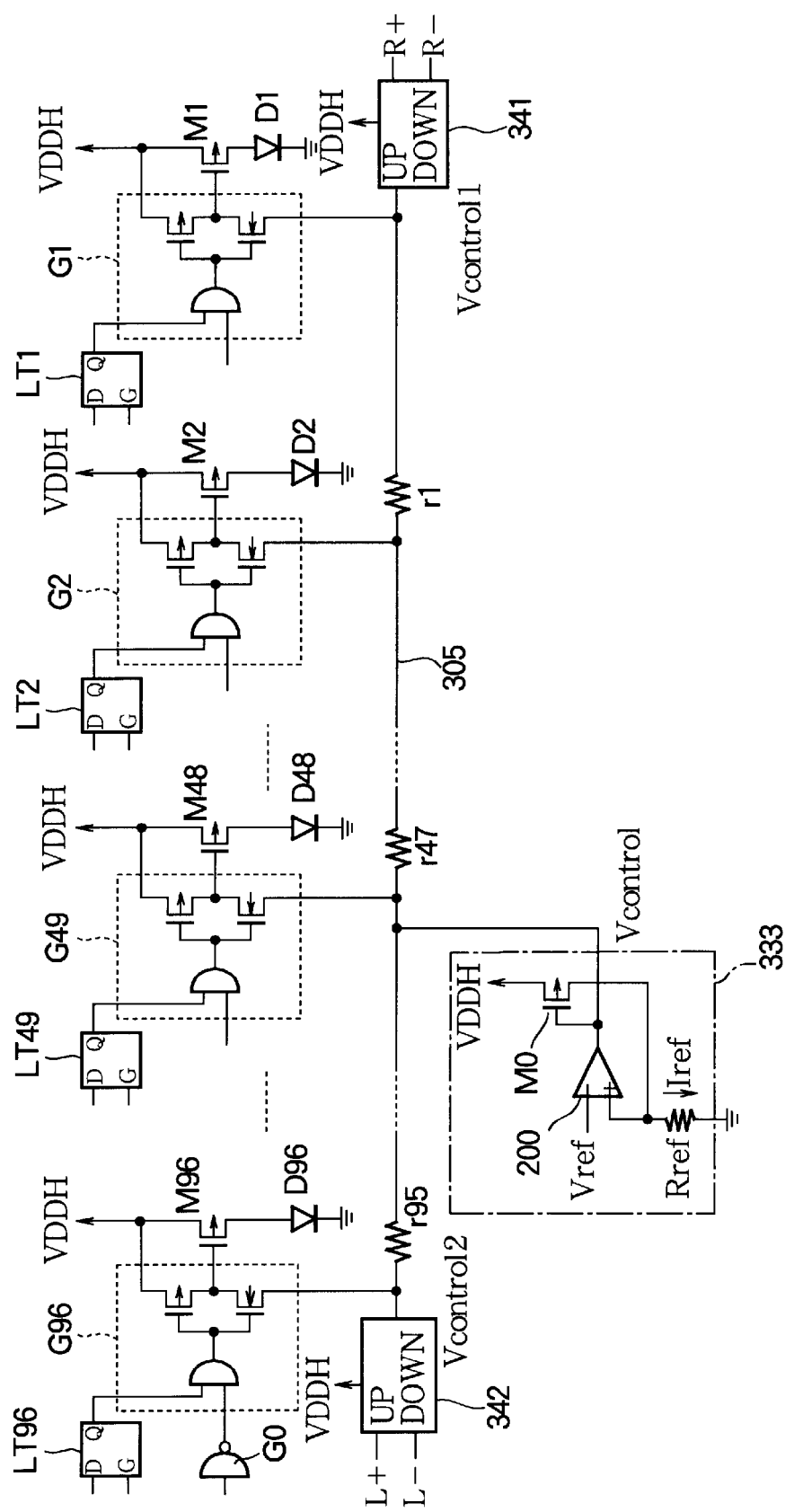
FIG. 7 shows connection relationships of the control voltage generator, pre-buffers, their peripheral circuits, and a pair of control voltage adjustment circuits in the driver IC in FIG. 5.

Since the second embodiment has only one reference transistor M0, it has only one control voltage generator. FIG. 7 shows the connection relationships of the control voltage generator 333 and the pre-buffers and associated circuits for dot1, dot2, dot49, and dot96.

The two control voltage adjustment circuits 341, 342 are both identical, each having UP and DOWN input terminals, a VDDH terminal, and a control voltage adjustment output terminal. A command signal L+ (described below) is input to the UP terminal of control voltage adjustment circuit 342; a command signal L− (described below) is input to the DOWN terminal. Control voltage adjustment circuit 342 also has a VDDH terminal connected to node S96 in FIG. 6, receiving the voltage supplied to the source electrode of driving transistor M96, and produces an adjusted control voltage Vcontrol2 at a control voltage adjustment output terminal, which is connected to the end of the conductive member 305 near pre-buffer G96. Similarly, command signals R+ and R− (described below) are input to the UP and DOWN terminals of control voltage adjustment circuit 341, the VDDH terminal of which is connected to node S1 in FIG. 6 to receive the voltage applied to the source electrode of driving transistor M1. This control voltage adjustment circuit 341 produces an adjusted control voltage Vcontrol1 at its control voltage adjustment output terminal, which is connected to the end of the conductive member 305 near pre-buffer G1.

Figure 8:
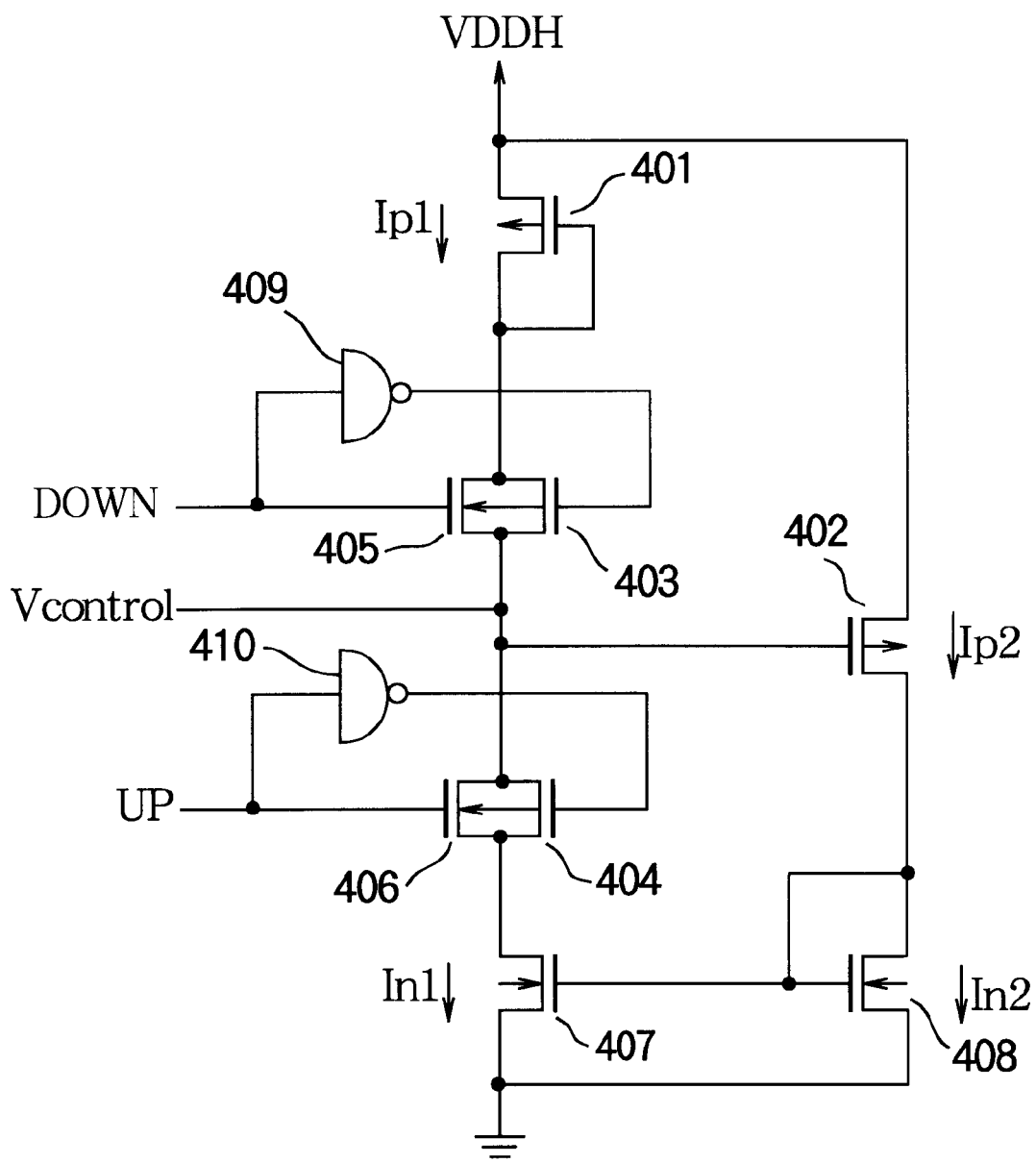
FIG. 8 is a circuit diagram showing the structure of the control voltage adjustment circuits in FIG. 7.

FIG. 8 shows the internal structure of the control voltage adjustment circuits 341, 342. Each control voltage adjustment circuit includes four p-channel MOS transistors 401–404, four n-channel MOS transistors 405–408, and a pair of inverters 409, 410.

Transistors 403 and 405 form an analog switch controlled from the DOWN input terminal, which is coupled to the gate electrode of transistor 405 and through inverter 409 to the gate electrode of transistor 403. Transistors 404 and 406 form an analog switch controlled from the UP input terminal, which is coupled to the gate electrode of transistor 406 and through inverter 410 to the gate electrode of transistor 404. The two analog switches are interconnected at a connecting node, and are in series with transistors 401 and 407. The connecting node is connected to the control voltage adjustment output terminal, here marked Vcontrol, and to the gate electrode of transistor 402. Vcontrol in FIG. 8 is equivalent to either Vcontrol1 or Vcontrol2 in FIG. 7.

The source electrodes of transistors 401 and 402 receive VDDH from node S1 or S96 in FIG. 6. The source electrodes of transistors 407 and 408 are connected to a ground node. The drain electrode of transistor 402 is connected to the drain electrode of transistor 408, and to the gate electrodes of transistors 407 and 408, which thus operate as a current mirror. Transistor 401 has its gate and drain electrodes interconnected, and operates as a current mirror with transistor 402 when the analog switch comprising transistors 403 and 405 is in the conducting state. Transistors 402 and 408 are thus connected in series between VDDH and ground, and in parallel with transistors 401 and 407 and the analog switches.

Transistors 401 and 402 have the same gate length as the driving transistors M1–M96, and since they also have the same gate-source voltage, their drain currents Ip1 and Ip2 mirror the LED driving current. The drain currents In1 and In2 of transistors 407 and 408 also mirror the LED driving current, since In2 is equal to Ip2.

Figure 9B:
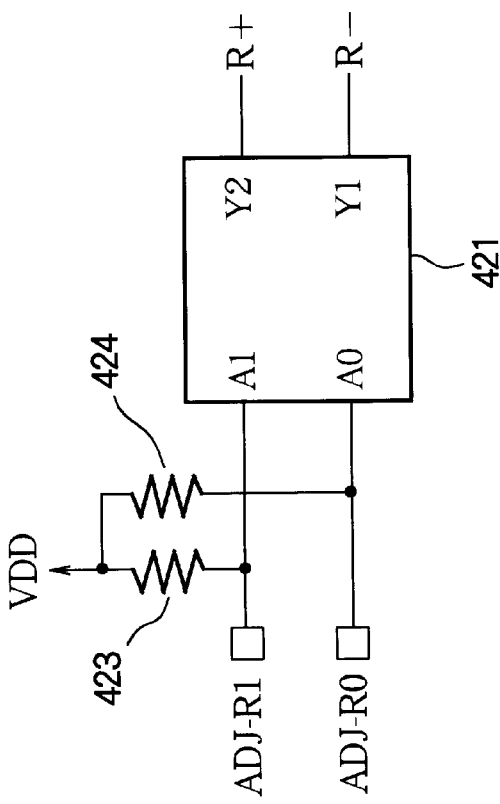
FIGS. 9A and 9B illustrates a pair of decoders that generate command signals for the control voltage adjustment circuits in FIG. 7.
Figure 9A:
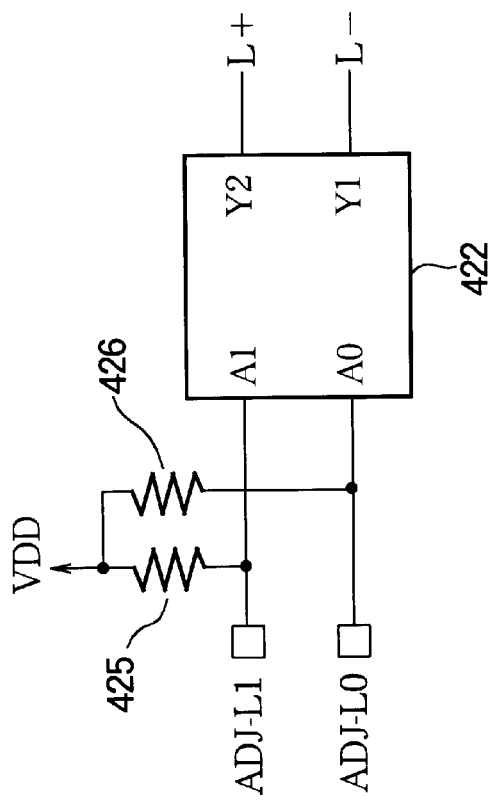

FIGS. 9A and 9B show decoders 421, 422 that generate the command signals input to the control voltage adjustment circuits 341, 342. The input terminals A1, A0 of decoder 422 are pulled up to the power supply VDD through respective resistances 425, 426, and are connected to respective current adjustment terminals ADJ-L1, ADJ-L0, which are among the input electrodes 301 (FIG. 5) of the driver IC. Similarly, the input terminals A1, A0 of decoder 421 are pulled up through resistances 423, 424, and are connected to current adjustment terminals ADJ-R1, ADJ-R0, which are also among the input electrodes 301 of the driver IC. Decoder 421 outputs command signals R− and R+ from output terminals Y1 and Y2, respectively. Decoder 422 outputs command signals L− and L+ from output terminals Y1 and Y2, respectively.

Figures 10, 11:
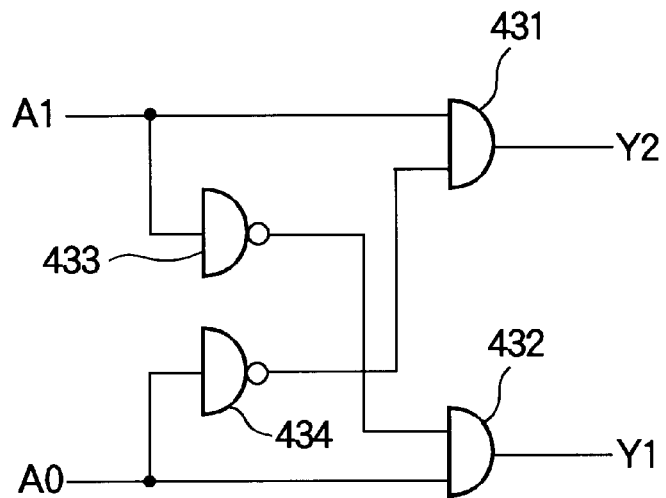
FIG. 10 is a circuit diagram showing the internal structure of the decoders in FIGS. 9A and 9B.
FIG. 11 is a truth table illustrating various modes of operation of the second embodiment.

FIG. 10 is a circuit diagram of the above decoders. Each decoder comprises a pair of AND gates 431, 432 and a pair of inverters 433, 434. Input terminal A1 of the decoder is connected to the input terminal of inverter 433 and one input terminal of AND gate 431, while input terminal A0 is connected to the input terminal of inverter 434 and one input terminal of AND gate 432. The outputs of inverters 433, 434 are connected to the other input terminals of AND gates 432, 431, respectively. The AND gates 431 and 432 output the command signals L+ and L− or R+ and R− in FIGS. 9A and 9B.

Next, the operation of control voltage adjustment circuits 341, 342 will be described.

To reduce the driving current supplied to the LED (D1 or D96) at one end of the array, the DOWN signal is set to the high logic level and the UP signal to the low logic level by a procedure described below, so the output of inverter 409 is low, the output of inverter 410 is high, the analog switch comprising transistors 403 and 405 is in the conducting state, and the analog switch comprising transistors 404 and 406 is in the non-conducting state. The control voltage adjustment circuit 341 or 342 now sources current Ip1 from VDDH through transistor 401 to the conductive member 305, thus to the Vcontrol output terminal of the control voltage generator 333 and the output terminal of the operational amplifier 200. The flow of this current through the wiring resistance of the conductive member 305 raises the potential Vcontrol1 or Vcontrol2 at the output terminal of the control voltage adjustment circuit 341 or 342, reducing the gate-source voltage of transistor M1 or M96 and decreasing its drain current, i.e., the LED driving current, which is mirrored by the drain current Ip1.

In the specific case in which control voltage Vcontrol2 is raised, the drain current Ip1 flows through a series resistance circuit consisting of wiring resistances r48, r49, . . . , r94, r95. The potential at resistance r48 is maintained at Vcontrol by the control voltage generator 333. The potentials of the successive nodes between r48 and r95 increase linearly from Vcontrol to Vcontrol2, because the conductive member 305 has uniform wiring width and is divided at equal intervals into resistances r1, . . . , r94, r95, which thus have identical resistance values. These node potentials are supplied as gate potentials to driving transistors M49, . . . , M95, M96. The gate-source voltages and drain currents of transistors M49, . . . , M95, M96 therefore decrease monotonically from M49 to M96.

A similar relation holds for transistors M1, M2, ..., M47, resistances r1, r2, ..., r47, and control voltage adjustment circuit 341.

Next, an adjustment to increase the driving current of the LED (D1 or D96) at one end of the driver IC will be described. In this adjustment, the UP signal is set to the high logic level and the DOWN signal to the low logic level. The output of inverter 409 is high, the output of inverter 410 is low, the analog switch comprising transistors 403 and 405 is in the non-conducting state, and the analog switch comprising transistors 404 and 406 is in the conducting state. The control voltage adjustment circuit 341 or 342 now sinks current from the conductive member 305 through transistor 407 to ground, this current (In1) mirroring the LED driving current of driving transistor M1 or M96. As this current In1 flows through the wiring resistances (r48, ..., r1 or r48, ..., r95) in the conductive member 305, a voltage drop occurs, lowering the potential Vcontrol1 or Vcontrol2 at the output terminal of control voltage adjustment circuit 341 or 342. As a result, the gate-source voltage of transistor M1 or M96 increases, so its drain current, i.e., the driving current, increases.

When it is not necessary to increase or decrease the driving current, the UP and DOWN signals are both preferably placed at the low logic level by the procedure described below, so that the outputs of inverters 409, 410 are both high and the analog switches consisting of transistors 403 and 405 and transistors 404 and 406 are both in the non-conducting state. As a result, no current flows between the control voltage adjustment circuit and the conductive member 305, and the control voltage is not adjusted either upward or downward.

FIG. 11 is a truth table illustrating various adjustment modes. When the LED head is manufactured, mode 0 is initially selected by wire-bonding the ADJ-L1, ADJ-L0, ADJ-R1, and ADJ-R0 terminals to a ground electrode on the above-mentioned printed wiring board. When the LED head is inspected, the amount of the light emitted by each LED in this condition is measured. Since ADJ-L1, ADJ-L0, ADJ-R1, and ADJ-R0 are all at the low logic level, the signals output from decoder terminals Y1 and Y2 in the control voltage adjustment circuits 341, 342 are also at the low logic level. All of the analog switches in the control voltage adjustment circuits 341, 342 are therefore in the non-conducting state, and the control voltage is not adjusted on either the left or right side of the driver C.

The inspection result in mode 0 is used to decide whether to increase or decrease the driving currents on the left and right sides of the driver IC. If, for example, the LEDs driven from the left side of the driver IC emit too much light, the bonding wire that connects the ADJ-L0 electrode to ground is removed. The ADJ-L0 electrode and input terminal A0 of decoder 422 are then pulled up to the high logic level, corresponding to mode 1 in FIG. 11, through resistor 426, so the L– signal output from terminal Y1 of decoder 422 to the DOWN input terminal of control voltage adjustment circuit 342 goes high, decreasing the driving current on the left side of the driver IC. If the LEDs driven from the left side of the driver IC emit too little light, the bonding wire that connects the ADJ-L1 electrode to ground is removed, corresponding to mode 2 in FIG. 11, and the L+ signal goes high, increasing the driving current on the left side of the driver IC. Similarly, the bonding wire can be removed from the ADJ-R0 electrode to decrease the driving current, or from the ADJ-R1 electrode to increase the driving current, on the right side of the driver IC.

In a variation of this operation, the ADJ-L0, ADJ-L1, ADJ-R0, and ADJ-R1 electrodes are initially left unconnected (mode 3 in FIG. 11). A bonding wire can then be attached between ADJ-L0 or ADJ-R0 and ground to increase the driving current, or between ADJ-L1 or ADJ-R1 and ground to decrease the driving current, on the corresponding side of the driver IC.

Figure 12:
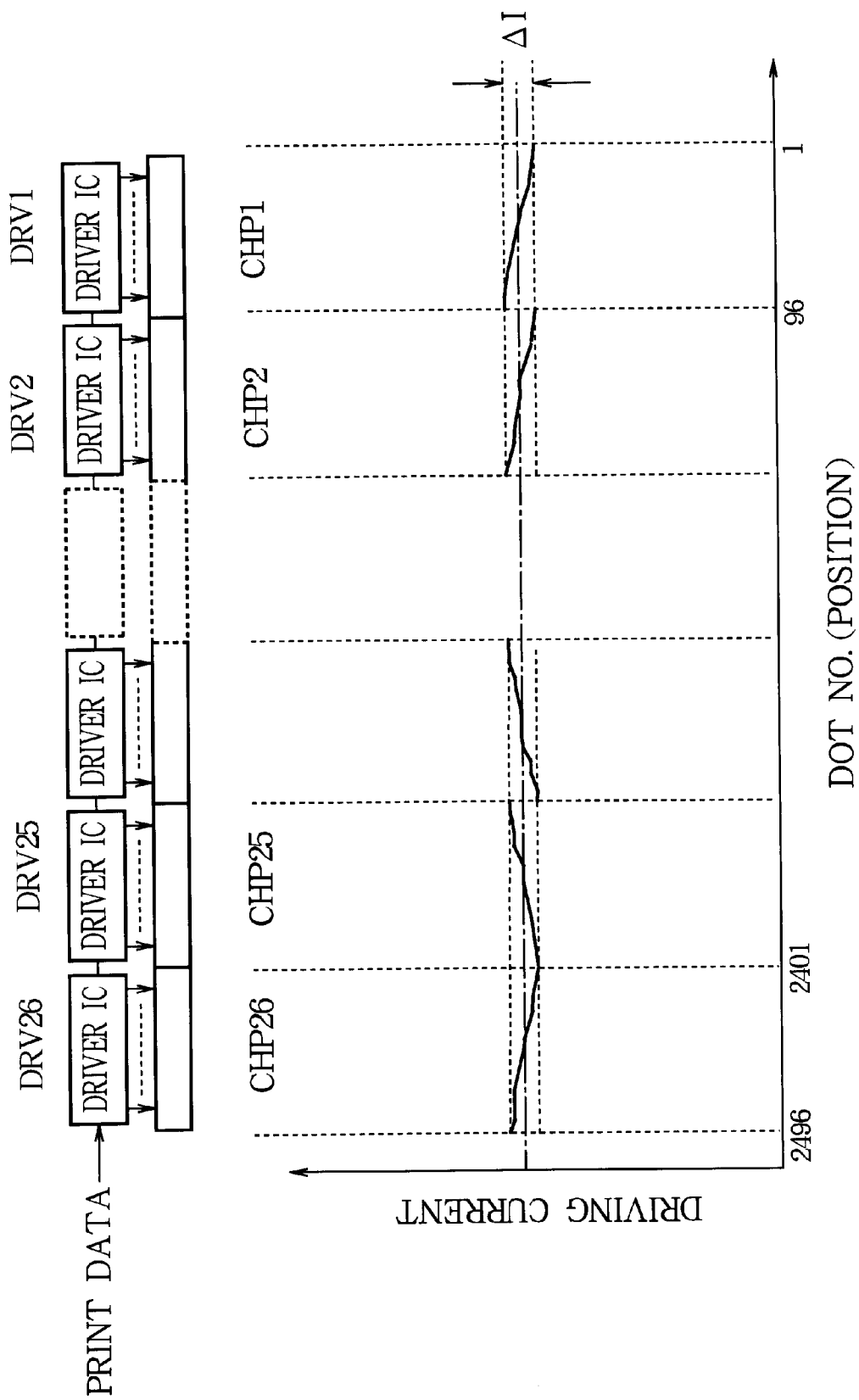
FIG. 12 shows an example of dot-to-dot variations in driving current in the second embodiment.

FIG. 12 shows an example of dot-to-dot variations in driving current in an LED head according to the second embodiment. The driver ICs in this LED head have been selected for uniform driving current at the center of each driver IC chip, and the driving current has been adjusted as necessary on the left side and the right side of each chip as described above, reducing the range of driving-current variation (ΔI) within each chip. The dot-to-dot variation in driving current within each driver IC is gradual, and any abrupt changes that may occur between two mutually adjacent dots in different driver IC chips are much smaller than the abrupt changes that can occur in a conventional LED head (FIG. 20). Variations in printing density caused by dot-to-dot variations in driving current can thus be considerably reduced as compared with the prior art.

Figure 13:
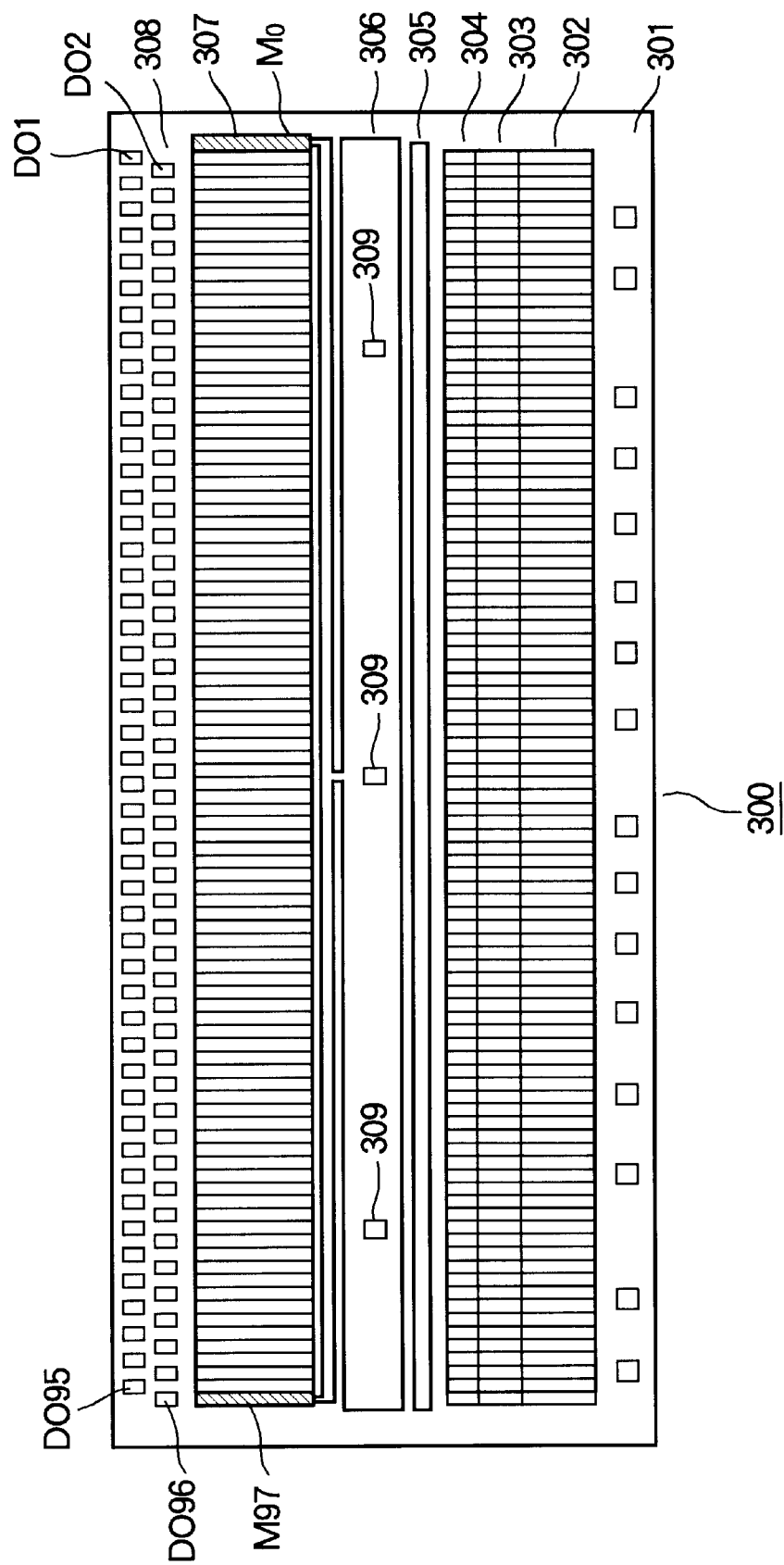
FIG. 13 is a schematic plan view showing the layout of a driver IC according to a third embodiment of the invention.

FIG. 13 schematically shows the layout of a driver IC in accordance with a third embodiment of the invention. Descriptions of elements identical to the corresponding elements in FIG. 5 will be omitted.

In the third embodiment, as in the second embodiment, the control voltage is generated at the center of the driver IC chip and adjusted at both ends of the chip. The third embodiment differs from the second embodiment in that the LED driving power supply voltage VDDH is detected by reference transistors positioned at both ends of the chip. The two reference transistors M0 and M97 are indicated by hatching in FIG. 13.

Figure 14:
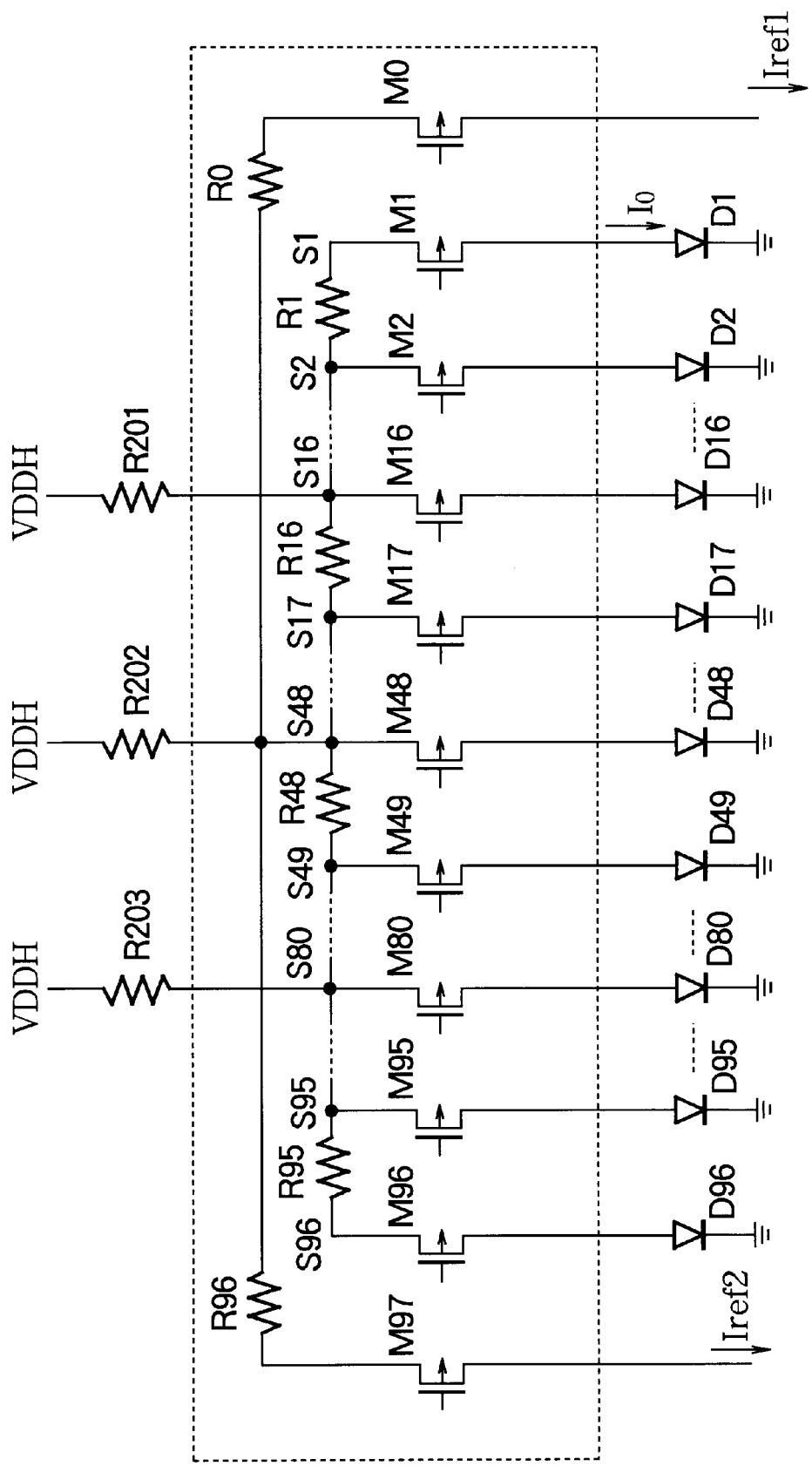
FIG. 14 is an equivalent circuit diagram showing the driving transistors in the driver IC in FIG. 13, and the driven LEDs.

FIG. 14 is an equivalent circuit showing the driving transistors in this driver IC and the driven LEDs. The two reference transistors M0 and M97 have the same gate length as the LED driving transistors M1–M96.

Figure 15:
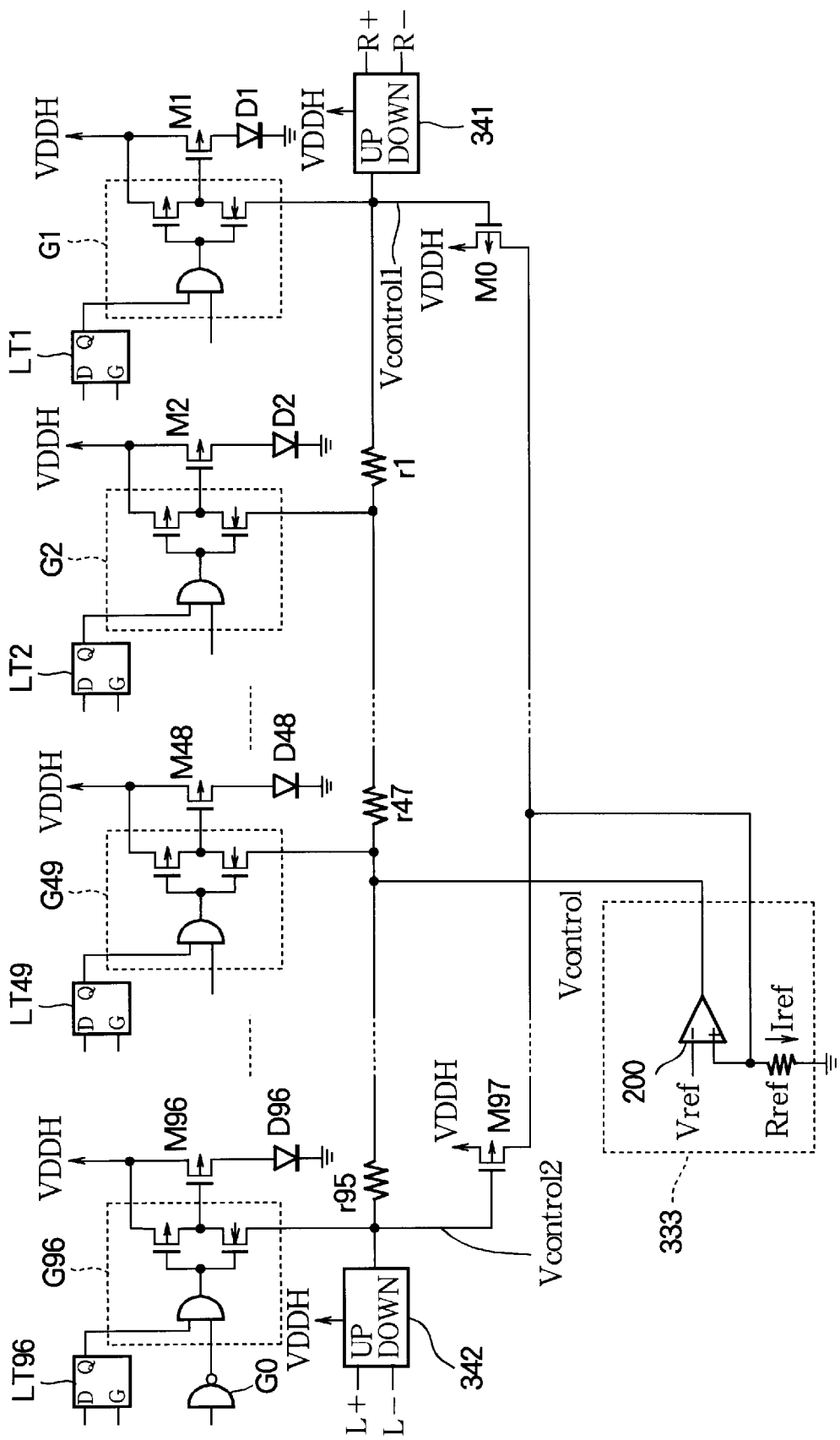
FIG. 15 shows connection relationships of the control voltage generator, its reference transistors, the pre-buffers, their peripheral circuits, and a pair of control voltage adjustment circuits in the driver IC in FIG. 13.
Figure 16:
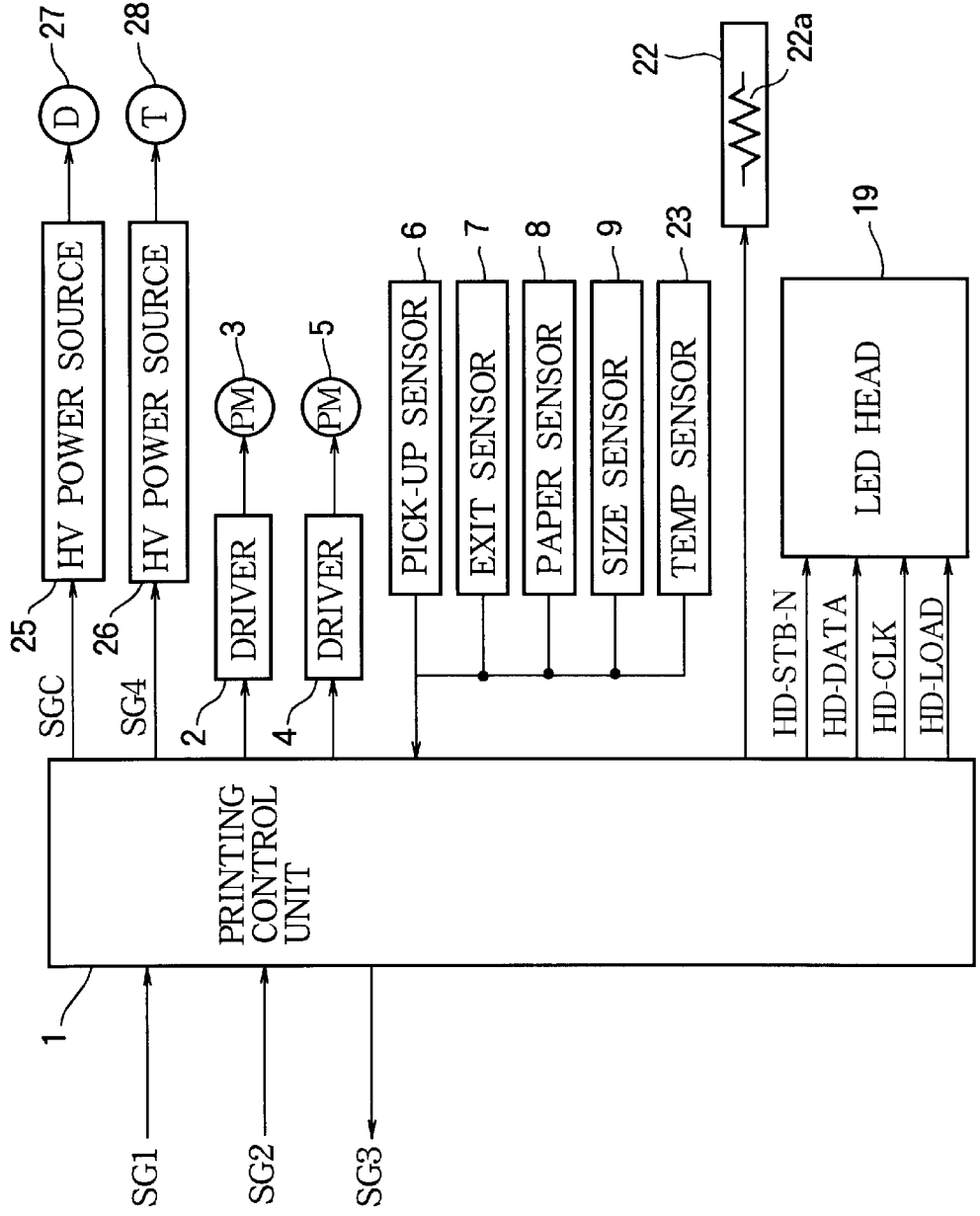
FIG. 16 is a block diagram showing the control system of an electrophotographic printer with an LED head.
Figure 17:
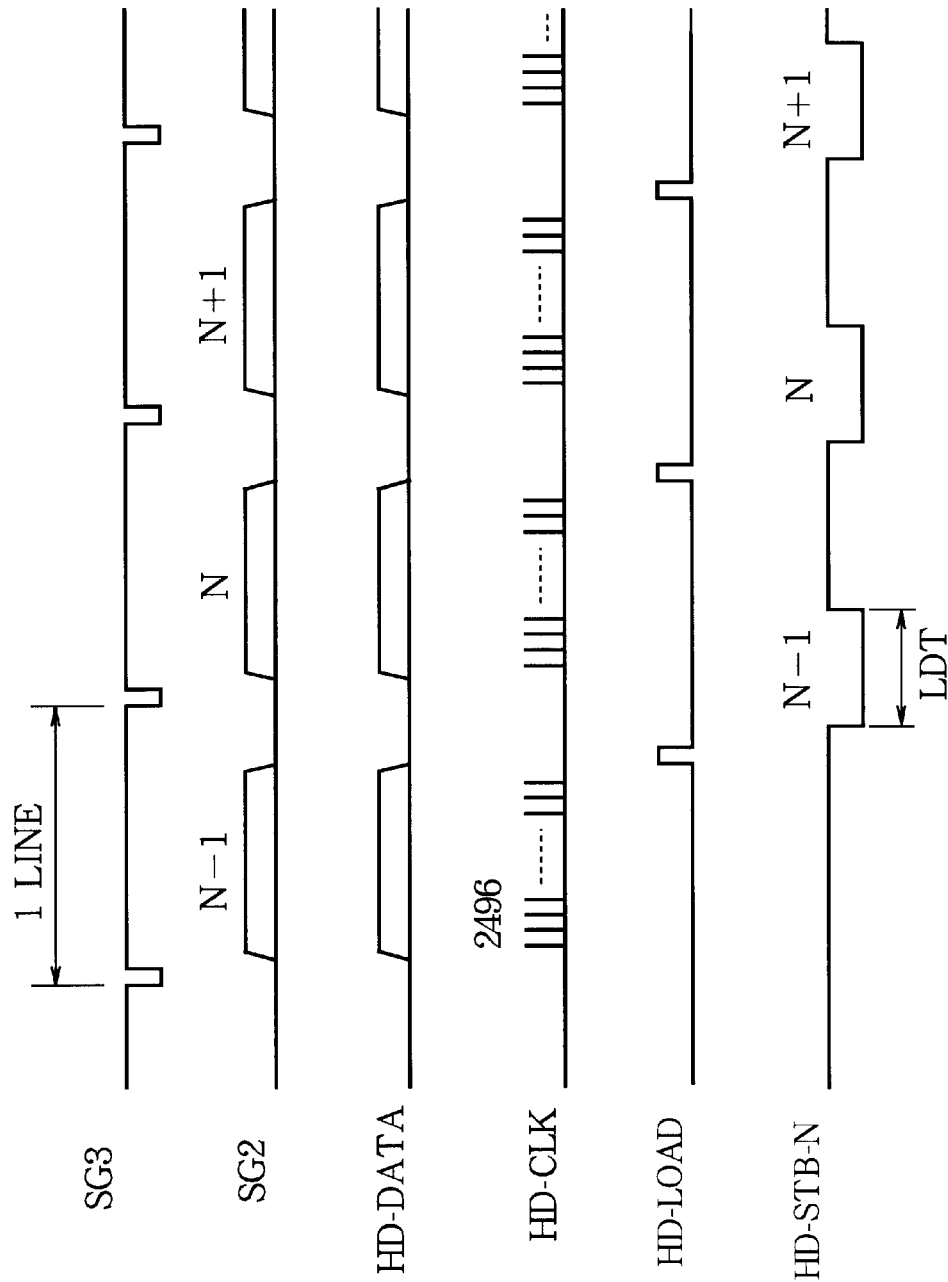
FIG. 17 is a timing diagram showing various signals in FIG. 16.

FIG. 15 shows the connection relationships of the control voltage generator 333, the control voltage adjustment circuits 341, 342, and the pre-buffers and their associated circuits in the third embodiment. The reference resistance Rref in the control voltage generator 333 is connected to the drain electrodes of both reference transistors M0, M97. The gate electrodes of reference transistors M0, M97 are connected to the conductive member 305 near the control voltage adjustment circuits 341, 342, respectively.

The control voltage Vcontrol at the center of the chip is therefore generated according to the average of the LED driving power supply voltage VDDH at the left and right ends of the chip, regardless of how the LEDs are driven. This arrangement is more robust than the conventional arrangement in which there is only one reference transistor, at one end of the chip, for the following reason.

In a given dot line, the left and right halves of the driver IC may drive significantly different numbers of LEDs. For example, LEDs D1 to D48 may all be driven simultaneously, while only a few of LEDs D49 to D96 are driven. VDDH will then be significantly lower at the right end of the array than in the middle of the array and at the left end. If there is only the conventional single reference transistor M0 disposed adjacent to driving transistor M1 at the right end of the array, feedback control will compensate for the reduced VDDH value at the right end by decreasing the control voltage Vcontrol until driving transistor M1 supplies the correct amount of driving current. Driving transistors near the middle of the array and on the left side will then supply too much current. In the third embodiment, since VDDH is detected at both ends of the chip, the reduced VDDH potential at the right end of the chip is averaged with the normal VDDH potential at the left end of the chip, so Vcontrol is not reduced as much and the driving current remains closer to the correct value overall.

The third embodiment provides the same effect as the second embodiment in reducing variations in driving current by adjusting the control voltage at both ends of the conductive member 305, and is also less likely to produce unwanted driving-current variations due to localized VDDH voltage drops.

Although the present invention has been described with reference an LED head in an electrophotographic printer, it is not limited to this application. The invention can be usefully applied for driving arrays of various types of elements, including resistive heat-emitting elements in thermal printers, and display elements in matrix-type display apparatus.

The present invention is particularly useful when practiced in an array head comprising a plurality of driver ICs, since it can reduce output differences between adjacent elements driven from different ICs, but the invention also reduces output variations in elements driven from a single IC.

Those skilled in the art will recognize that many variations in the above embodiments are possible within the scope of the appended claims.

What is claimed is:

1. A driving circuit, comprising:
   an array of driving elements disposed on a single chip; and
   a conductive member having a plurality of nodes coupled to respective driving elements in the array of driving elements and having respective resistances between the plurality of nodes, the plurality of nodes including a first node for receiving a first voltage and a second node for receiving a second voltage that is different from the first voltage.

2. The driving circuit of claim 1, wherein the driving elements drive light-emitting diodes used as light sources in an electrophotographic printer.

3. The driving circuit of claim 1, further comprising:
   a first reference element disposed on the same chip as the array of driving elements, adjacent to at least one of the driving elements;
   a second reference element disposed on the same chip as the array of driving elements, adjacent to at least one of the driving elements;
   means for adjusting the first voltage according to an output of the first reference element; and
   means for adjusting the second voltage according to an output of the second reference element.

4. The driving circuit of claim 3, wherein the array of driving elements is disposed between the first reference element and the second reference element.

5. The driving circuit of claim 4, wherein the array of driving elements has a first end and a second end, the first reference element is disposed at the first end of the array, and the second reference element is disposed at the second end of the array.

6. The driving circuit of claim 5, wherein the driving elements, the first reference element, and the second reference element are transistors electrically coupled to the conductive member.

7. The driving circuit of claim 6, wherein the driving elements, the first reference element, and the second reference element have mutually identical gate lengths.

8. The driving circuit of claim 5, wherein the means for adjusting the first voltage includes a first reference resistance coupled in series with the first reference element, and the means for adjusting the second voltage comprises a second reference resistance coupled in series with the second reference element.

9. The driving circuit of claim 8, wherein the first reference resistance and the second reference resistance are mutually adjacent.

10. The driving circuit of claim 1, further comprising means for switching the first voltage.

11. The driving circuit of claim 10, wherein the driving circuit receives a power supply and the means for switching the first voltage comprises:
    a first transistor having a gate electrode coupled to the first node of the conductive member;
    a second transistor coupled in series with the first transistor between the power supply and a ground node, the second transistor having a gate electrode and a drain electrode, the gate electrode of the second transistor being connected to the drain electrode of the second transistor;
    a third transistor having a gate electrode coupled to the gate electrode of the second transistor;
    a fourth transistor coupled in series with the third transistor between the power supply and the ground node, the third and fourth transistors being coupled in parallel with the first and second transistors between the power supply and the ground node, the fourth transistor having a gate electrode and a drain electrode, the gate electrode of the fourth transistor being connected to the drain electrode of the fourth transistor;
    a pair of switches coupled in series with the third transistor and the fourth transistor; and
    a connecting node disposed in series between the third transistor and the fourth transistor, and between said switches, the connecting node being coupled to the first node of the conductive member.

12. The driving circuit of claim 1, wherein the conductive member also has a third node disposed between the first node and the second node, the third node receiving a third voltage.

13. The driving circuit of claim 12, further comprising;
    a first reference element disposed on the same chip as the array of driving elements, adjacent to at least one of the driving elements;
    a second reference element disposed on the same chip as the array of driving elements, adjacent to at least another one of the driving elements; and
    means for adjusting the third voltage according to outputs of the first reference element and the second reference element.

14. The driving circuit of claim 13, wherein the first voltage, the second voltage, and the third voltage are divided by the resistances of the conductive member and the resulting divided voltages are supplied to the driving elements.

15. The driving circuit of claim 14, wherein the driving elements, the first reference element, and the second refer ence element are transistors with gate electrodes coupled to the conductive member.

16. The driving circuit of claim 15, wherein the driving elements, the first reference element, and the second reference element have mutually identical gate lengths.

17. The driving circuit of claim 12, further comprising:
 a reference element disposed on the same chip as the array of driving elements, adjacent to at least two of the driving elements; and
 means for adjusting the third voltage according to an output of the reference element.

18. The driving circuit of claim 17, wherein the reference element is disposed at a center of the array of driving elements.

19. The driving circuit of claim 18, wherein the driving elements and the reference element are transistors with gate electrodes coupled to the conductive member.

20. The driving circuit of claim 19, wherein the driving elements and the reference element have mutually identical gate lengths.

* * * * *